(12) United States Patent
Kurose et al.

(10) Patent No.: US 9,412,561 B2
(45) Date of Patent: Aug. 9, 2016

(54) ION IMPLANTATION METHOD AND ION IMPLANTATION APPARATUS

(71) Applicant: Sumitomo Heavy Industries Ion Technology Co., Ltd., Tokyo (JP)

(72) Inventors: Takeshi Kurose, Ehime (JP); Noriyasu Ido, Ehime (JP); Hiroyuki Kariya, Ehime (JP)

(73) Assignee: Sumitomo Heavy Industries Ion Technology Co., Ltd., Tokyo (JP)

( * ) Notice: Subject to any disclaimer, the term of this patent is extended or adjusted under 35 U.S.C. 154(b) by 0 days.

(21) Appl. No.: 14/696,060

(22) Filed: Apr. 24, 2015

(65) Prior Publication Data

US 2015/0311077 A1 Oct. 29, 2015

(30) Foreign Application Priority Data

Apr. 25, 2014 (JP) ................................. 2014-091762

(51) Int. Cl.
*G01R 31/26* (2014.01)
*H01J 37/304* (2006.01)
*H01J 37/30* (2006.01)
*H01J 37/317* (2006.01)

(52) U.S. Cl.
CPC .......... *H01J 37/304* (2013.01); *H01J 37/3002* (2013.01); *H01J 37/3171* (2013.01); *H01J 2237/24514* (2013.01)

(58) Field of Classification Search
None
See application file for complete search history.

(56) References Cited

U.S. PATENT DOCUMENTS

| 4,494,005 | A | * | 1/1985 | Shibata | H01J 37/304 250/397 |
| 4,922,106 | A | | 5/1990 | Berrian et al. | |
| 4,980,562 | A | | 12/1990 | Berrian et al. | |
| 5,046,148 | A | * | 9/1991 | Nogami | H01J 37/3171 250/398 |
| 5,068,539 | A | * | 11/1991 | Nogami | H01J 37/3171 250/398 |
| 5,180,918 | A | * | 1/1993 | Isobe | H01J 37/3171 250/397 |
| 6,167,169 | A | * | 12/2000 | Brinkman | G02F 1/011 385/10 |

(Continued)

FOREIGN PATENT DOCUMENTS

| JP | H03-241651 A | 10/1991 |
| JP | 2699170 B2 | 1/1998 |

(Continued)

*Primary Examiner* — David E Graybill
(74) *Attorney, Agent, or Firm* — Michael Best & Friedrich LLP

(57) ABSTRACT

An ion implantation apparatus includes a beam scanner, a beam measurement unit that is able to measure an ion irradiation amount distribution in a beam scanning direction at a wafer position, and a control unit that outputs a control waveform to the beam scanner for scanning an ion beam. The control unit includes an output unit that outputs a reference control waveform to the beam scanner, an acquisition unit that acquires the ion irradiation amount distribution measured for the ion beam scanned based on the reference control waveform from a beam measurement unit, and a generation unit that generates a correction control waveform by using the acquired ion irradiation amount distribution. The control unit outputs the correction control waveform so that the ion irradiation amount distribution becomes a target distribution and the ion irradiation amount distribution per unit time becomes a target value.

19 Claims, 18 Drawing Sheets

(56) References Cited

U.S. PATENT DOCUMENTS

| | | | |
|---|---|---|---|
| 6,169,015 B1* | 1/2001 | Fu-Kang | H01J 37/304 250/492.21 |
| 6,313,474 B1* | 11/2001 | Iwasawa | H01J 37/3171 250/397 |
| 6,696,688 B2* | 2/2004 | White | H01J 37/147 250/396 ML |
| 7,095,022 B2* | 8/2006 | Nakasuji | B82Y 10/00 250/310 |
| 7,259,082 B2* | 8/2007 | Tanaka | B23K 26/0736 257/E21.134 |
| 7,323,700 B1* | 1/2008 | Ledoux | H01J 37/1474 250/396 ML |
| 7,375,354 B2* | 5/2008 | Iwasawa | H01J 37/3171 250/492.21 |
| 7,800,080 B2* | 9/2010 | Tanaka | B23K 26/0736 250/492.1 |
| 7,888,652 B2* | 2/2011 | Fujita | H01J 37/1475 250/396 ML |
| 8,008,176 B2* | 8/2011 | Bateman | B01J 37/20 438/308 |
| 8,138,484 B2* | 3/2012 | Vanderberg | H01J 37/1475 250/396 ML |
| 8,368,036 B2* | 2/2013 | Hino | H01J 37/1472 250/492.21 |
| 8,772,142 B2* | 7/2014 | Ninomiya | C23C 14/48 250/492.21 |
| 8,906,708 B2* | 12/2014 | Yokokawa | H01J 37/3005 257/E21.248 |
| 9,111,719 B1* | 8/2015 | Satoh | H01J 37/304 |
| 2001/0013578 A1* | 8/2001 | Seki | H01J 37/1475 250/396 R |
| 2002/0109099 A1* | 8/2002 | White | H01J 37/147 250/396 R |
| 2004/0065643 A1* | 4/2004 | Tanaka | B23K 26/0736 219/121.8 |
| 2005/0181584 A1* | 8/2005 | Foad | H01J 37/08 438/514 |
| 2008/0157008 A1* | 7/2008 | Tanaka | B23K 26/0736 250/492.22 |
| 2011/0215263 A1* | 9/2011 | Hino | H01J 37/1472 250/492.21 |
| 2011/0297842 A1 | 12/2011 | Ninomiya et al. | |
| 2012/0104285 A9* | 5/2012 | Hino | H01J 37/1472 250/492.21 |
| 2012/0196428 A1* | 8/2012 | Asai | H01J 37/09 438/527 |
| 2012/0244691 A1* | 9/2012 | Ninomiya | C23C 14/48 438/514 |
| 2012/0252194 A1 | 10/2012 | Ninomiya et al. | |
| 2012/0322248 A1* | 12/2012 | Ninomiya | H01J 37/3171 438/514 |
| 2013/0130484 A1* | 5/2013 | Wan | H01L 21/265 438/514 |
| 2013/0196492 A1* | 8/2013 | Ninomiya | H01L 21/265 438/527 |
| 2013/0295753 A1* | 11/2013 | Hwang | H01L 21/265 438/514 |
| 2014/0004688 A1* | 1/2014 | Asai | H01J 37/09 438/527 |
| 2014/0134833 A1* | 5/2014 | Tsukihara | H01J 37/302 438/514 |
| 2014/0235042 A1* | 8/2014 | Ninomiya | C23C 14/48 438/514 |

FOREIGN PATENT DOCUMENTS

| | | |
|---|---|---|
| JP | 3027072 B2 | 3/2000 |
| JP | 2011-258353 A | 12/2011 |
| JP | 2012-204327 A | 10/2012 |

* cited by examiner

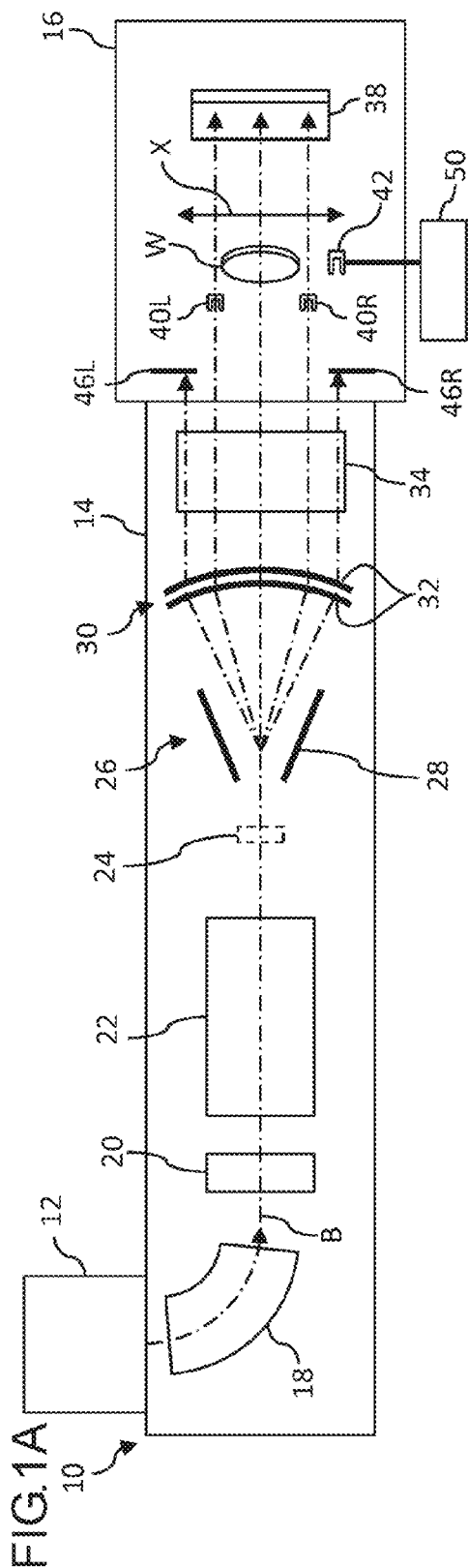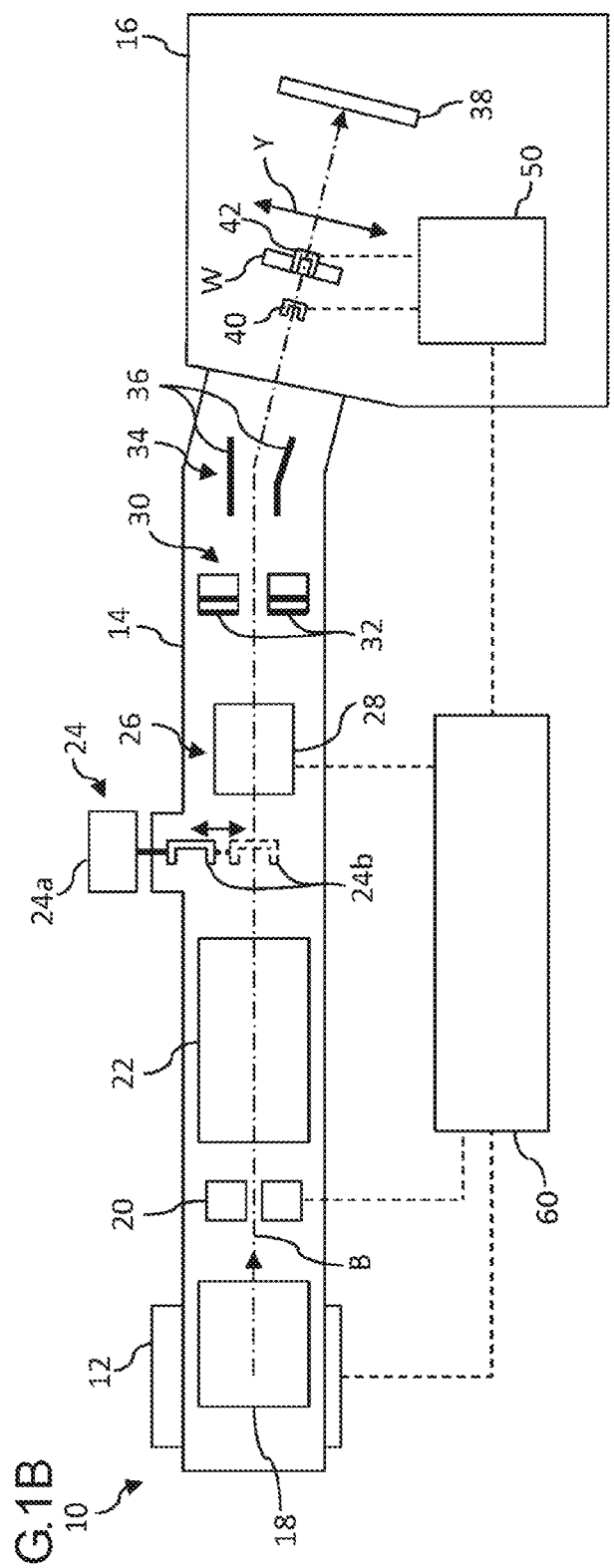

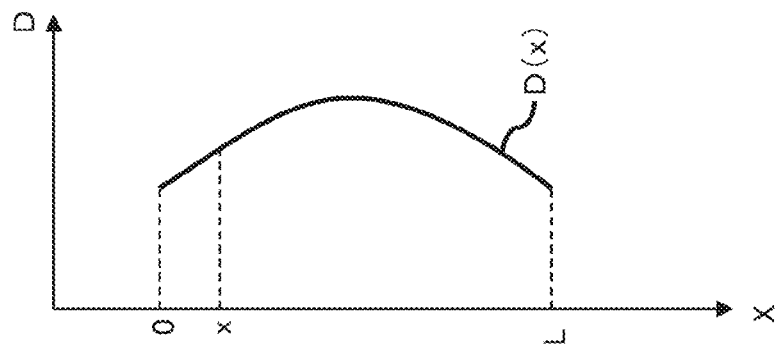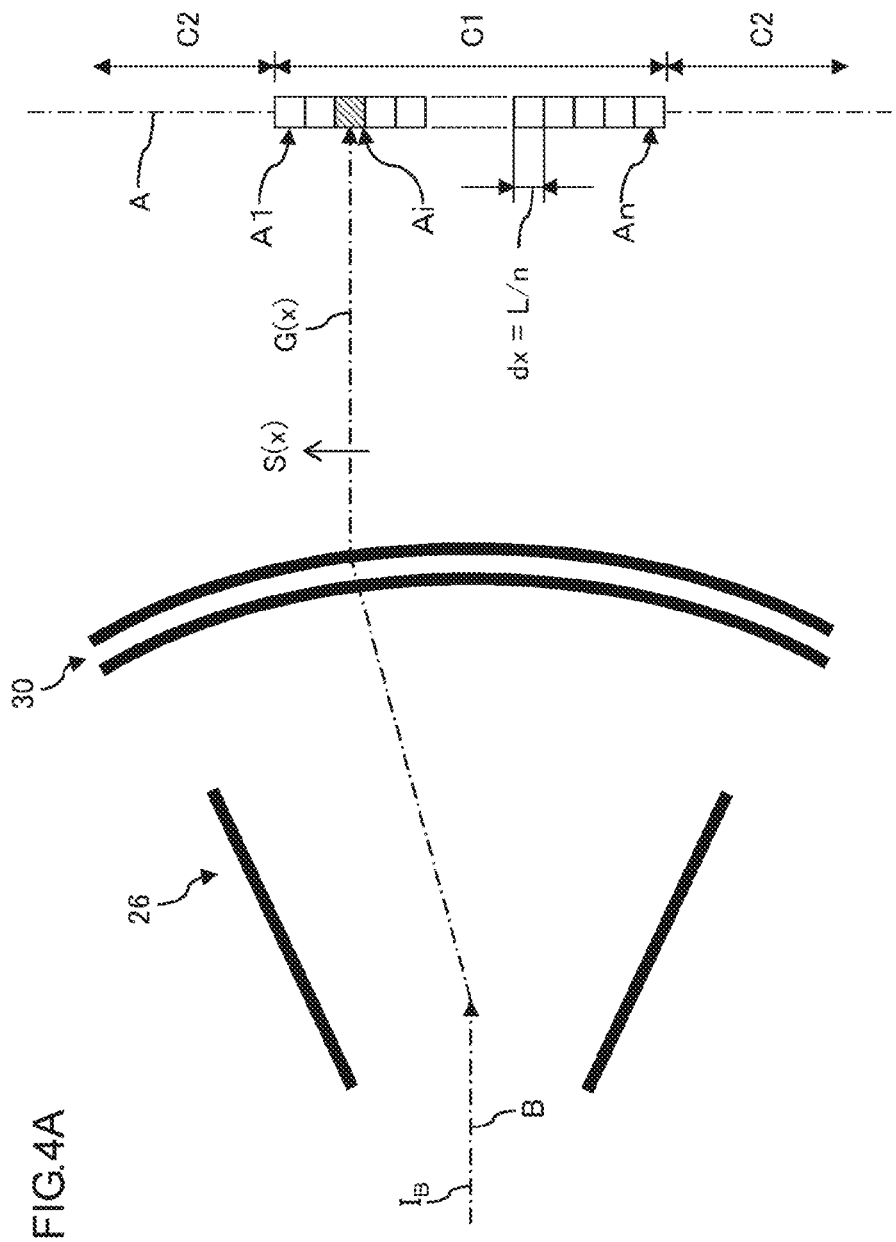

ION IMPLANTATION METHOD AND ION IMPLANTATION APPARATUS

RELATED APPLICATION

Priority is claimed to Japanese Patent Application No. 2014-091762, filed on Apr. 25, 2014, the entire content of which is incorporated herein by reference.

BACKGROUND OF THE INVENTION

1. Field of the Invention

The present invention relates to an ion implantation method and an ion implantation apparatus.

2. Description of the Related Art

In a semiconductor production process, a step (hereinafter, referred to as an "ion implantation step") of implanting ions to a semiconductor wafer is generally performed for the purpose of changing the conductivity and the crystalline structure of the semiconductor wafer. An apparatus that is used in the ion implantation step is called an ion implantation apparatus, and has a function of forming an ion beam ionized by an ion source and accelerated and a function of transporting the ion beam to an implantation processing chamber and irradiating the ion beam to a wafer inside the processing chamber.

In order to implant ions into an entire surface of a wafer as a processing target, a beam scanner scans an ion beam in a reciprocating manner while reciprocating the wafer in a direction perpendicular to the beam scanning direction. At this time, it is possible to control the amount of the ion beam irradiated to each point of the wafer by changing a beam scanning speed or a reciprocating speed in accordance with the irradiation position on the wafer.

Although it is possible to control the amount of the ion irradiated to each point by changing the beam scanning speed in accordance with each point of the wafer, there is a case in which the amount of the ion irradiated to each point per unit time may be changed by a change in beam scanning speed. Since the amount of the damage for the wafer caused by the implantation of the ion is changed by the ion irradiation amount per unit time, there is a concern that maintenance of a semiconductor production quality may be affected when the ion irradiation amount per unit time changes.

SUMMARY OF THE INVENTION

The invention is made in view of such circumstances, and an object thereof is to provide a technique of controlling both an ion irradiation amount distribution and an ion irradiation amount per unit time.

According to an aspect of the invention, there is provided an ion implantation method for implanting ions into a wafer by scanning an ion beam in a reciprocating manner while reciprocating the wafer in a direction perpendicular to a beam scanning direction, the ion implantation method including: scanning the ion beam by outputting a reference control waveform to a beam scanner; measuring an ion irradiation amount distribution of the ion beam in the beam scanning direction, wherein the ion beam is scanned based on the reference control waveform; generating a correction control waveform by using the measured ion irradiation amount distribution; and irradiating the ion beam to the wafer by outputting the generated correction control waveform to the beam scanner, wherein the ion beam is scanned based on the correction control waveform. The reference control waveform is a control waveform for scanning the ion beam so that a scanning speed distribution indicating a change value of each beam position in time in the beam scanning direction at a wafer position becomes a first scanning speed distribution and a scanning period becomes a first scanning period. The ion irradiation amount distribution indicates the distribution of the total ion irradiation amount of each beam position in the beam scanning direction at the wafer position when scanning the ion beam over the wafer a predetermined number of times in a reciprocating manner. The correction control waveform is a control waveform for scanning the ion beam so that the scanning speed distribution becomes a second scanning speed distribution and a scanning period becomes a second scanning period. The second scanning speed distribution is a scanning speed distribution for scanning the ion beam so that the ion irradiation amount distribution becomes a target distribution. The second scanning period is a scanning period that is adjusted so that the ion irradiation amount distribution per unit time of the ion beam scanned by the second scanning speed distribution becomes a target value. The generating the correction control waveform includes calculating the second scanning speed distribution by using the first scanning speed distribution and the measured ion irradiation amount distribution and calculating the second scanning period by using the calculated second scanning speed distribution.

According to another aspect of the invention, there is provided an ion implantation apparatus. The ion implantation apparatus includes: a beam scanner; a reciprocation device that is provided at the downstream side of the beam scanner and reciprocates a wafer in a direction perpendicular to a beam scanning direction; a beam measurement unit that is able to measure an ion irradiation amount distribution in the beam scanning direction at a wafer position; and a control unit that outputs a control waveform to the beam scanner for scanning the ion beam in a reciprocating manner. The control unit includes an output unit that outputs a reference control waveform to the beam scanner, an acquisition unit that acquires the ion irradiation amount distribution measured for the ion beam scanned based on the reference control waveform from the beam measurement unit, and a generation unit that generates a correction control waveform by using the acquired ion irradiation amount distribution. The reference control waveform is a control waveform for scanning the ion beam so that a scanning speed distribution indicating a change value of each beam position in time in the beam scanning direction at a wafer position becomes a first scanning speed distribution and a scanning period becomes a first scanning period. The ion irradiation amount distribution indicates the distribution of the total ion irradiation amount of each beam position in the beam scanning direction at the wafer position when scanning the ion beam over the wafer a predetermined number of times in a reciprocating manner. The correction control waveform is a control waveform for scanning the ion beam so that the scanning speed distribution becomes a second scanning speed distribution and a scanning period becomes a second scanning period. The second scanning speed distribution is a scanning speed distribution for scanning the ion beam so that the ion irradiation amount distribution becomes a target distribution. The second scanning period is a scanning period that is adjusted so that the ion irradiation amount distribution per unit time of the ion beam scanned by the second scanning speed distribution becomes a target value. The generation unit includes a first calculation unit that calculates the second scanning speed distribution by using the first scanning speed distribution and the acquired ion irradiation amount distribution and a second calculation unit that calculates the second scanning period by using the calculated second scanning speed distribution. The generated correction control waveform is output to the beam scanner, and the ion beam scanned based on the correction control waveform is irradiated to the wafer.

In addition, the arbitrary combination of the components or the expression or the components of the invention may be substituted in the method, the apparatus, and the system and the substitution thereof may be effectively used as the aspect of the invention.

BRIEF DESCRIPTION OF THE DRAWINGS

FIG. 1A is a top view illustrating the schematic configuration of an ion implantation apparatus according to an embodiment and FIG. 1B is a side view illustrating the schematic configuration of the ion implantation apparatus according to the embodiment;

FIG. 4A is a schematic view illustrating a method for measuring an ion irradiation amount distribution and FIG. 4B is a graph illustrating an example of the measured ion irradiation amount distribution;

DETAILED DESCRIPTION OF THE INVENTION

Figure 2:
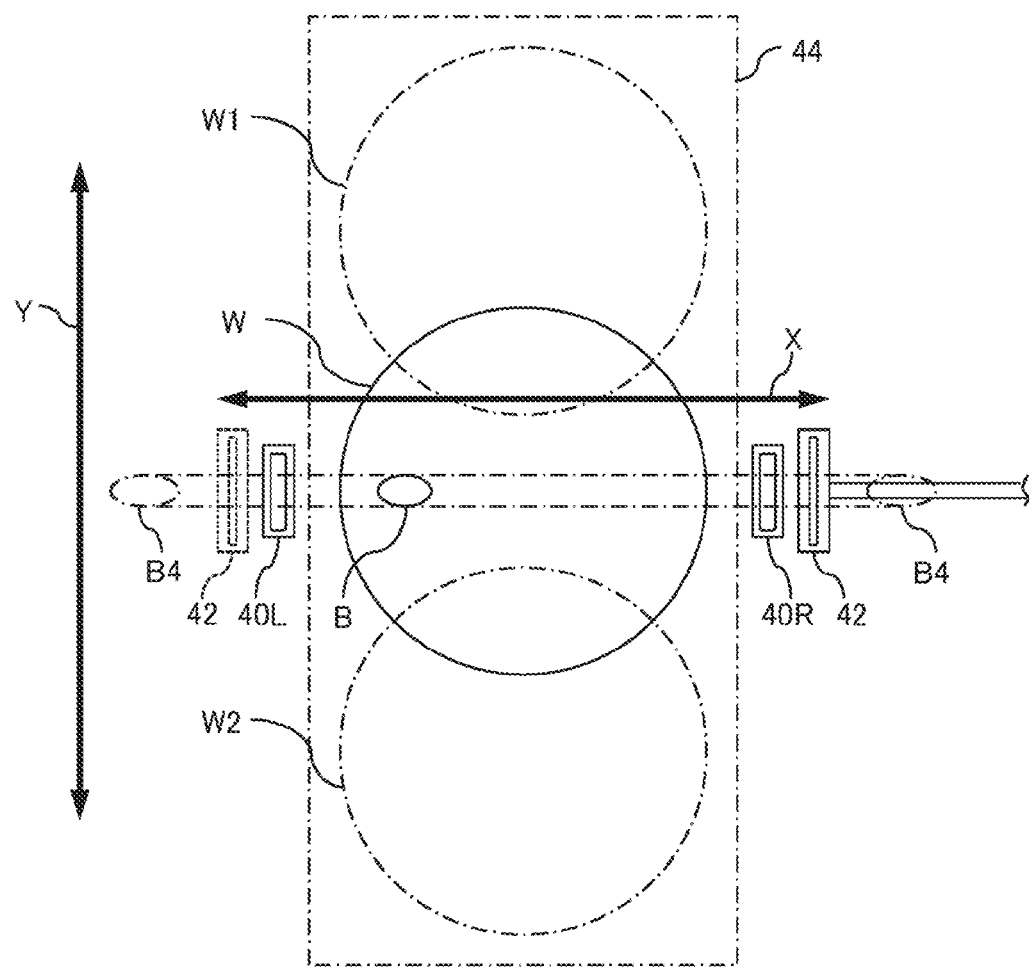
FIG. 2 is a front view illustrating a relation between a reciprocated wafer and a scanned ion beam.

The invention will now be described by reference to the preferred embodiments. This does not intend to limit the scope of the present invention, but to exemplify the invention.

Hereinafter, embodiments of the present invention will be described in detail with reference to the drawings. The same reference sign will be assigned to the same element in the drawings, and duplicate description thereof will not be presented as is appropriate. The configurations described below are merely examples but are not for purposes of limiting the scope of the present invention.

Prior to the description of the embodiment, the outline of the invention will be described. An ion implantation apparatus according to the embodiment includes a beam scanner for scanning an ion beam, a beam measurement unit that measures an ion irradiation amount distribution in the beam scanning direction at a wafer position, and a control unit that outputs a control waveform to the beam scanner for scanning the ion beam in a reciprocating manner. The control unit controls the ion irradiation amount distribution by determining a scanning speed distribution representing a change in time of each beam position in the beam scanning direction at the wafer position and outputting a control waveform for realizing the scanning speed distribution. For example, the ion irradiation amount is increased by decreasing the scanning speed at the position where the ion irradiation amount measured by the beam measurement unit is small. Meanwhile, the ion irradiation amount is decreased by increasing the scanning speed at the position where the ion irradiation amount is large.

However, when the scanning speed distribution is changed by increasing or decreasing the scanning speed of each point, the scanning period as the time taken for scanning the ion beam in a reciprocating manner changes. If the scanning period changes even when the ion irradiation amount (the ion irradiation amount distribution) for each point during one reciprocating scanning operation is the same before and after the adjustment of the scanning speed distribution, the ion irradiation amount per unit time (the ion irradiation amount distribution per unit time) for each point changes. When the ion irradiation amount per unit time changes, the damage amount for the wafer caused by the ion implantation will change. As a result, there is a possibility that the ion implantation processing cannot be performed as expected.

Here, in the embodiment, the scanning period is adjusted without causing a change in the ion irradiation amount per unit time even when the scanning speed distribution is changed. Specifically, the ion beam over-scans the wafer so that the scanning speed distribution becomes a desired distribution within a range of a wafer. At this time, the scanning period taken for one reciprocating scanning of the ion beam is adjusted by adjusting the time in which the ion beam is located outside range of the wafer. Accordingly, the quality of the ion implantation processing is improved by controlling both the ion irradiation amount distribution and the ion irradiation amount per unit time.

FIG. 1 is a schematic diagram that illustrates an ion implantation apparatus 10 according to an embodiment. FIG. 1A is a top view that illustrates a schematic configuration of the ion implantation apparatus 10, and FIG. 1B is a side view that illustrates a schematic configuration of the ion implantation apparatus 10.

The ion implantation apparatus 10 is configured to perform the ion implantation processing on the surface of the target W. The target W is, for example, a substrate. For example, the substrate may be a semiconductor wafer. Thus, for convenience of description, the target W may be referred to as the wafer W. However, it is not intended that the target of the implantation processing is limited to a specific object.

The ion implantation apparatus 10 is configured to irradiate the ion beam B to the entire wafer W by at least one of the operations of scanning the beam in a reciprocating manner and reciprocating the wafer W. In the present specification, for convenience of description, the traveling direction of the ion beam B in design is defined as the Z direction, and the plane perpendicular to the Z direction is defined as the XY plane. In the case where the ion beam B is scanned over the target W, the scanning direction of the beam is defined as the X direction, and the direction perpendicular to the Z direction and the X direction is defined as the Y direction . Thus, the beam scanning is performed in the X direction, and the reciprocation of the wafer W is performed in the Y direction.

The ion implantation apparatus 10 includes an ion source 12, a beam line device 14, and an implantation processing chamber 16. The ion source 12 is configured to supply the ion beam B to the beam line device 14. The beam line device 14 is configured to transport ions from the ion source 12 to the implantation processing chamber 16. In addition, the ion implantation apparatus 10 includes a vacuum pumping system (not illustrated in the figure) that is used for providing a desired vacuum environment for the ion source 12, the beam line device 14, and the implantation processing chamber 16.

As illustrated in the drawings, a beam line device 14 includes, for example, a mass analyzing unit 18, a variable aperture 20, a beam focusing/defocusing unit 22, a first beam measurement unit 24, a beam scanner 26, a parallelizing lens 30 or a beam parallelizing device, and an angular energy filter (AEF) 34 in order from the upstream side. In addition, the upstream side of the beam line device 14 indicates the side near an ion source 12, and the downstream side indicates the side near an implantation processing chamber 16 (or a beam stopper 38).

The mass analyzing unit 18 is provided at the downstream side of the ion source 12, and is configured to analyze the necessary ion species from the ion beam B extracted from the ion source 12.

The variable aperture 20 is an aperture capable of adjusting the aperture width, and adjusts the beam current amount of the ion beam B passing through the aperture by changing the aperture width. The variable aperture 20 includes, for example, upper and lower aperture plates which are disposed on the beam line interposed therebetween, and may adjust the beam current amount by changing the gap between the aperture plates.

The beam focusing/defocusing unit 22 includes a focusing lens such as a quadrupole focusing device (Q-lens), and is configured to shape the ion beam B which has passed through the variable aperture 20 into a desired cross-sectional shape.

The first beam measurement unit 24 is disposed so as to move into or out of the beam line, and is an injector flag faraday cup for measuring the current of the ion beam. The first beam measurement unit 24 includes a faraday cup 24b which measures a beam current and a driving unit 24a which moves the faraday cup 24b up and down. When the faraday cup 24b is disposed on the beam line as indicated by the dashed line of FIG. 1B, the ion beam B is interrupted by the faraday cup 24b. Meanwhile, when the faraday cup 24b is separated from the beam line as indicated by the solid line of FIG. 1B, the interruption of the ion beam B is canceled.

The beam scanner 26 is a deflection unit which is configured to scan the focused ion beam B in reciprocating manner in the X direction. The beam scanner 26 includes scanning electrodes 28 which are separated from each other in the X direction . The scanning electrodes 28 are connected to a variable voltage source (not illustrated), and deflect the ion beam B by changing an electric field generated between the electrodes in accordance with a change in the voltage applied to the scanning electrodes 28. In this way, the ion beam B is scanned over the scanning range in the X direction. In addition, the scanning direction and the scanning range of the beam indicated by the arrow X are exemplified in FIG. 1A, and a plurality of lines of the ion beam B in the scanning range are indicated by the dash-dotted chain lines.

The parallelizing lens 30 is configured to cause the traveling direction of the scanned ion beam B to be parallel to each other. The parallelizing lens 30 includes a circular-arc P-lens electrode 32 having an ion beam passage slit at the center portion thereof. The P-lens electrode 32 is connected to a high-voltage power supply (not illustrated), and sets the traveling direction of the ion beam B in parallel by exerting the electric field generated by supplied voltage to the ion beam B.

The angular energy filter 34 analyzes the energy of the ion beam B, deflects the ion which has desired energy downward, and leads the ion to the implantation processing chamber 16. The angular energy filter 34 includes a magnetic field deflection magnet (not illustrated) and an electric field deflection AEF electrode 36. A high-voltage power supply (not illustrated) is connected to the AEF electrode 36. In FIG. 1B, a positive voltage is applied to the upper AEF electrode 36 and a negative voltage is applied to the lower AEF electrode 36, so that the ion beam B is deflected downward.

In this way, the beam line device 14 supplies the ion beam B to be irradiated to the wafer W to the implantation processing chamber 16.

The implantation processing chamber 16 includes a reciprocation device 44 (see FIG. 2) which holds one or plural wafers W and supplies the wafer W to the ion beam B if necessary by the relative movement (for example, in the Y direction). FIG. 1B illustrates a state where the wafer W moves in a reciprocating manner along the arrow Y. Further, the implantation processing chamber 16 includes the beam stopper 38. When the wafer W does not exist on the beam path, the ion beam B is input to the beam stopper 38.

The implantation processing chamber 16 is provided with a second beam measurement unit 50 which measures the ion irradiation amount of the ion beam. The second beam measurement unit 50 includes side cups 40R and 40L and a center cup 42.

The side cups 40R and 40L are disposed so as to be deviated from the wafer W in the X direction, and are disposed at a position where the ion beam directed to the wafer W is not interrupted during the ion implantation processing. Since the ion beam B is over-scanned in a range exceeding the range of the wafer W, a part of the scanning beam is input to the side cups 40R and 40L even in the ion implantation processing. Accordingly, the ion irradiation amount of the ion implantation processing is measured. The measurement values of the side cups 40R and 40L are transmitted to the second beam measurement unit 50.

The center cup 42 is used to measure the ion irradiation amount distribution of the surface of the wafer W. The center cup 42 is movable, and is retracted from the wafer position during the ion implantation processing, and is inserted into the wafer position when the wafer W does not exist at the irradiation position. The center cup 42 measures the ion irradiation amount distribution in the beam scanning direction by measuring the ion irradiation amount while the center cup 42 being moved in the X direction. The measurement value of the center cup 42 is transmitted to the second beam measurement unit 50. In addition, the center cup 42 may be formed in an array shape in which a plurality of faraday cups are arranged in the X direction so as to simultaneously measure the ion irradiation amount of a plurality of positions in the beam scanning direction.

The implantation processing chamber 16 is provided with protective plates 46R and 46L. The protective plates 46R and 46L are disposed so as to be deviated from the wafer W in the X direction, and are disposed at a position where the ion beam directed to the wafer W or the ion beam directed to the side cups 40R and 40L is not interrupted during the ion implantation processing. The protective plates 46R and 46L prevent the ion beam, which is over-scanned in a range exceeding the range of the wafer W, from being irradiated to the inner wall of the implantation processing chamber 16 or the device provided inside the implantation processing chamber 16. The protective plates 46R and 46L are composed of graphite or the like. In addition, the protective plates 46R and 46L may be provided at the downstream side of the beam scanner 26 or may be provided at the beam line device 14.

The control unit 60 controls the operation of each of the devices constituting the ion implantation apparatus 10. The control unit 60 adjusts the scanning speed distribution and the scanning period of the ion beam by generating the control waveform for scanning the ion beam and outputting the control waveform to the beam scanner 26. Further, the control unit 60 acquires the value of the ion irradiation amount and the ion irradiation amount distribution measured by the second beam measurement unit 50 in order to adjust the control waveform. In addition, the control unit 60 controls a beam current adjustment unit like the ion source 12 or the variable aperture 20 provided at the upstream side of the beam scanner 26 in order to adjust the beam current amount of the ion beam before scanned. Further, the control unit 60 controls the operation of the reciprocation device 44.

FIG. 2 is a front view illustrating a relation between the reciprocated wafer W and the scanned ion beam B. In FIG. 2, the ion beam B is scanned in the horizontal direction (the X direction), and the wafer W is reciprocated in the vertical direction (the Y direction) while being held by the reciprocation device 44. FIG. 2 illustrates the operation range of the reciprocation device 44 by illustrating the wafer W1 at the uppermost position and the wafer W2 at the lowermost position.

Further, in the ion beam B scanned by the beam scanner, the scanning range of the ion beam is indicated by the ion beam B4 at the scanning end position. The ion beam B is configured to be over-scanned in a range passing through the positions of the side cups 40R and 40L disposed at the right and left sides of the reciprocation device 44 or the position of the center cup 42 movable in the X direction. In addition, FIG. 2 illustrates a state where the ion beam B which is long in the horizontal direction is scanned. However, the shape of the ion beam B may be long in the vertical direction or may be substantially circular.

Figure 3:
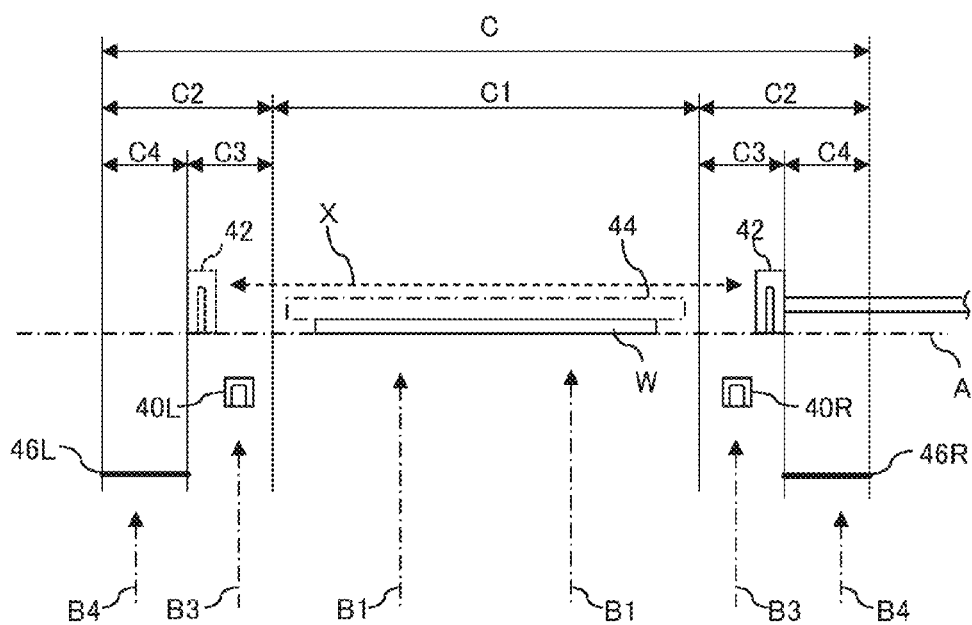
FIG. 3 is a top view illustrating a scanning range of the ion beam.

FIG. 3 is a view illustrating the scanning range of the ion beam B and corresponds to the top view of FIG. 2. In FIG. 3, the entire scannable range of the ion beam B is indicated by a scanning range C. The scanning range C may be roughly classified into two ranges of an irradiation area C1 and a non-irradiation area C2. The irradiation area C1 is the range of the wafer W, and may be called an inner range in relation to the positions of the side cups 40R and 40L. Thus, the ion beam B1 directed to the irradiation area C1 is input to the wafer W reciprocated by the reciprocation device 44, and hence the ion beam contributes to the ion implantation processing. Meanwhile, the non-irradiation area C2 is an area which is located at the outside of the irradiation area C1 and corresponds to the outside of the range of the wafer W. Thus, the ion beams B3 and B4 which are directed to the non-irradiation area C2 are not input to the wafer W reciprocated by the reciprocation device 44, and do not contribute to the ion implantation processing.

Further, the non-irradiation area C2 includes a side measurement position C3 and a scanning end position C4. The side measurement position C3 corresponds to the installation positions of the side cups 40R and 40L. Since the ion beams B3 which are directed to the side measurement positions C3 are input to the side cups 40R and 40L, the ion irradiation amount can be measured even during the ion implantation processing by scanning the ion beam up to the side measurement positions C3. The scanning end positions C4 correspond to the installation positions of the protective plates 46R and 46L. Thus, the ion beams B4 which are directed to the scanning end positions C4 are input to the protective plates 46R and 46L. For that reason, since the ion beam is scanned up to the scanning end position C4, it is possible to prevent the ion beam from being irradiated to an unexpected position inside the implantation processing chamber 16.

As illustrated in FIG. 3, the movable center cup 42 may measure the ion irradiation amount distribution at the position A corresponding to the wafer surface in a partial range (for example, a range excluding the scanning end position C4) of the irradiation area C1 and the non-irradiation area C2. The position A corresponds to the same position of the wafer surface in the Z direction with respect to the Z direction as the traveling direction of the ion beam B. When the irradiation area C1 is divided into about one thousand micro zones and the ion irradiation amount is measured for each micro zone while the center cup 42 is moved in the X direction, the ion irradiation amount distribution in the beam scanning direction (the X direction) on the wafer surface may be obtained.

FIG. 4A is a schematic view illustrating a method for measuring the ion irradiation amount distribution, and FIG. 4B is a graph illustrating an example of the measured ion irradiation amount distribution $D(x)$. As illustrated in FIG. 4A, the zone corresponding to the irradiation area C1 is divided into n number of minute zones A1 to An with respect to the position A corresponding to the wafer surface. The division number n is, for example, about 1000 due to the resolution of the ion irradiation amount distribution to be measured. When the length of the irradiation area C1 is indicated by L, the width dx of each minute zone satisfies the relation of $dx=L/n$. Additionally, in FIG. 4A, the zone which corresponds to the irradiation area C1 is set as the measurement target of the ion irradiation amount distribution, but the non-irradiation area C2 which is located outside the irradiation area C1 may be included as the measurement target of the ion irradiation amount distribution.

FIG. 4A illustrates a state where the ion beam B is input to the i-th minute zone Ai among the n number of the minute zones. Further, the ion input amount G(x) per unit time of the ion beam B which is input to the position x and the scanning speed S(x) of the ion beam B at the position x are expressed where the position of the minute zone Ai is indicated by the variable x. The ion input amount G(x) per unit time becomes a different value at each position due to the non-linearity caused by the optical design of the beam line device and the like. Here, in the embodiment, the ion input amount G(x) per unit time at the position A is expressed as the function of the variable x. Here, the ion input amount G(x) per unit time corresponds to the average value in time of the ion input amount which is input to the position x when the ion beam B stays at the specific position x without any scanning operation. In addition, the ion input amount G(x) per unit time may increase or decrease in proportion to the value of the beam current amount $I_B$ of the ion beam B which is input to the beam scanner 26.

The time dt necessary for the ion beam B having the scanning speed S(x) and passing through the minute zone dx may be expressed by dt=dx/S(x). When the ion beam of the ion input amount G(x) per unit time passes through the minute zone dx once in an one-way manner, the ion irradiation amount D(x) irradiated to the minute zone dx is expressed by D(x)=G(x)dt and D(x)=dx*G(x)/S(x). When the ion irradiation amount D(x) is measured at each of the minute zones A1 to An, the graph of the ion irradiation amount distribution illustrated in FIG. 4B may be obtained.

Here, since the ion irradiation amount distribution D(x) which is expressed as the function of the position x determines the ion implantation amount for each place of the wafer W, there is a need to control the ion irradiation amount distribution in order to perform the ion implantation processing as expected. For example, when there is a need to perform a uniform ion implantation processing on the entire wafer W, it is desirable to set the uniform ion irradiation amount distribution. Meanwhile, when there is a need to implant a large amount of ion to a part of the wafer W compared to the other part thereof, it is desirable to set the non-uniform ion irradiation amount distribution.

In order to obtain the ion irradiation amount distribution having a desired shape, the value of the ion irradiation amount D(x) at each minute zone dx may be determined. From the above-described relation of D(x)=dx*G(x)/S(x), the ion input amount G(x) per unit time and the scanning speed S(x) may be controlled in order to control the ion irradiation amount D(x). At this time, since the ion input amount G(x) per unit time depends on the optical arrangement of the beam line device and the like, it is difficult to arbitrarily control the ion input amount G(x) per unit time in response to the position x. Meanwhile, the scanning speed S(x) may be arbitrarily controlled by a certain degree by changing the voltage waveform of the beam scanner. Here, in the embodiment, the ion irradiation amount distribution is controlled by controlling the scanning speed S(x).

Figure 5A:
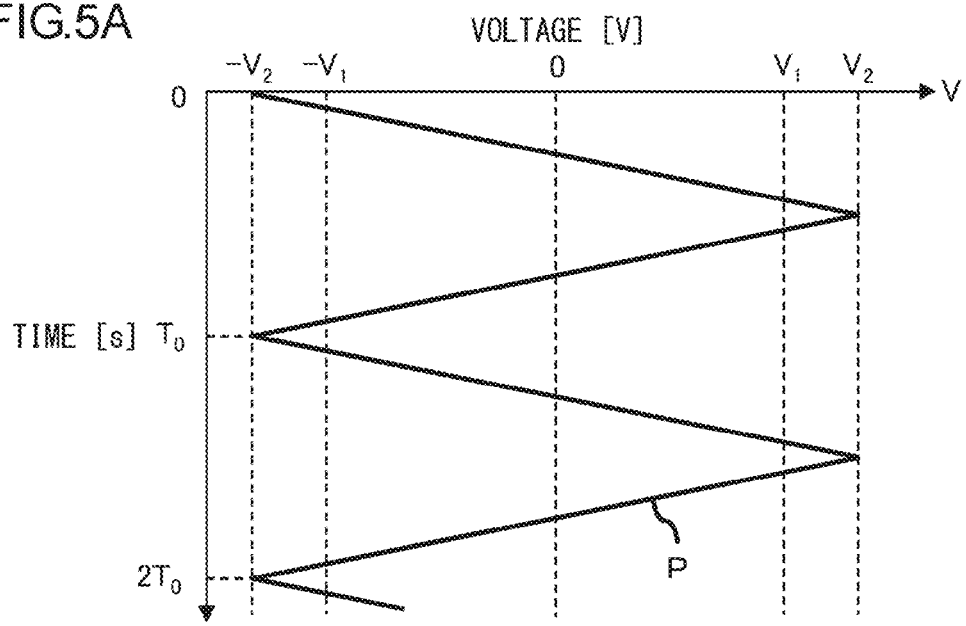
FIG. 5A is a graph illustrating an example of a reference control waveform.

FIG. 5A is a graph illustrating a reference control waveform P. Here, the reference control waveform P indicates the control waveform which is output to the beam scanner 26 before the ion irradiation amount distribution is adjusted to an arbitrary shape. Further, in the embodiment, the control waveform may be the scanning voltage waveform which is applied to the beam scanner 26, and indicates the waveform representing a change in time of a potential difference across both electrodes of the scanning electrodes 28. In addition, the control waveform which is output from the control unit 60 to the beam scanner 26 may be a control signal for controlling the beam scanner 26 so that the voltage waveform applied to the beam scanner 26 is depicted as the graph illustrated in FIG. 5A. The control waveform in this case may have any shape as long as a signal for generating the voltage waveform illustrated in FIG. 5A is generated.

As illustrated in FIG. 5A, the reference control waveform P is a triangular wave of which the amplitude is a second voltage $V_2$ and repetition period is $T_0$. The second voltage $V_2$ corresponds to the scanning voltage in which the ion beam is directed to the non-irradiation area C2. Further, a first voltage $V_1$ which is smaller than the second voltage $V_2$ corresponds to the scanning voltage in which the ion beam is directed to the vicinity of the boundary between the irradiation area C1 and the non-irradiation area C2. Thus, when the ion beam is scanned based on the reference control waveform P illustrated in FIG. 5A, the ion beam is over-scanned up to an area exceeding the irradiation area C1.

Figure 5B:
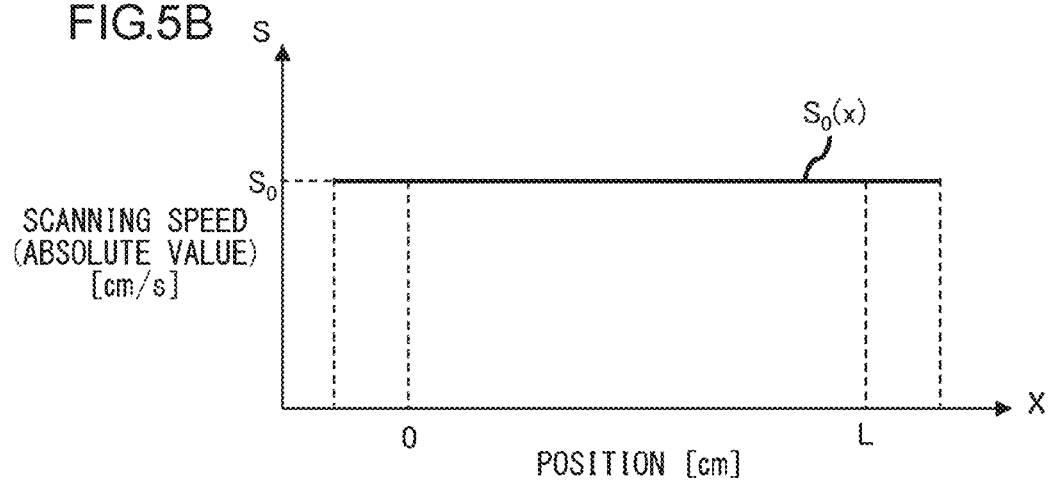
FIG. 5B is a graph illustrating an example of a scanning speed distribution of an ion beam scanned by the reference control waveform.

FIG. 5B is a graph illustrating an example of the scanning speed distribution $S_0(x)$ of the ion beam scanned by the reference control waveform P, and illustrates a state where the scanning speed becomes a constant speed $S_0$ regardless of the place. In addition, FIG. 5B illustrates the absolute value of the scanning speed, and the forward and backward paths for the reciprocating scanning operation have positive and negative reversal scanning speed values. Further, the graph of the scanning speed below also illustrates the absolute value of the scanning speed similarly to FIG. 5B.

The scanning speed S corresponds to V(t)/dt as the temporal differentiation of the voltage V(t) which is applied to the beam scanner. For that reason, the scanning speed becomes a constant value $S_0$ in the triangular wave which changes linearly with respect to the time. In addition, when the triangular wave is applied as the reference control waveform P, the scanning speed does not need to be constant at all times, and a scanning speed distribution having a different speed in accordance with the place may be set. Further, in the present specification, the scanning speed distribution $S_0(x)$ corresponding to the reference control waveform P is referred to as the "first scanning speed distribution".

Figure 5C:
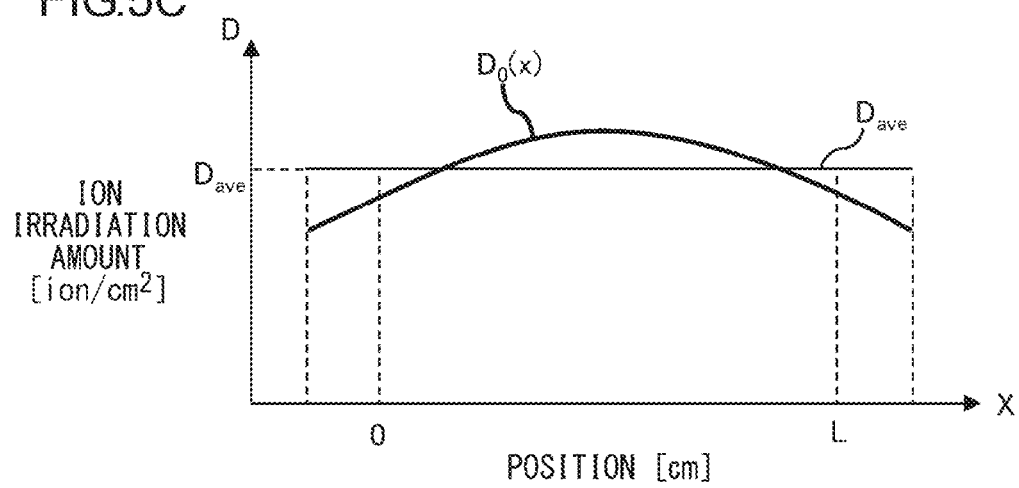
FIG. 5C is a graph illustrating an example of an ion irradiation amount distribution of an ion beam scanned by the reference control waveform.

FIG. 5C is a graph illustrating an example of the ion irradiation amount distribution $D_0(x)$ of the ion beam scanned by the reference control waveform P. FIG. 5C illustrates the ion irradiation amount distribution $D_0(x)$ in the case where the ion irradiation amount in the vicinity of the center of the irradiation area is larger and the ion irradiation amount in the vicinity of both ends of the irradiation area is smaller. Since the scanning speed S(x) is the constant value $S_0$, it may be mentioned that the ion input amount G(x) per unit time is not linear with respect to the position x from the relation of D(x)=dx*G(x)/S(x). If there is a need to uniformly implant the ion into the wafer W, a problem of such an ion irradiation amount distribution occurs. Here, the ion irradiation amount distribution is adjusted by adjusting the first scanning speed distribution. In addition, the average value $D_{ave}$ indicates the average value in space of the ion irradiation amount in the entire scanning area.

When the ion input amount G(x) does not change before and after the adjustment, the unadjusted ion irradiation amount distribution $D_0(x)$ may be expressed as $D_0(x)$=dx*G(x)/$S_0(x)$, and the adjusted ion irradiation amount distribution $D_1(x)$ may be expressed as $D_1(x)$=dx*G(x)/$S_1(x)$. Here, $S_0(x)$ indicates the unadjusted scanning speed distribution (the first scanning speed distribution), and $S_1(x)$ indicates the adjusted scanning speed distribution. When both equations are joined, the adjusted scanning speed distribution is expressed by $S_1(x)$=$S_0(x)$*$D_0(x)$/$D_1(x)$. Thus, the adjusted scanning speed distribution $S_1(x)$ for obtaining the desired ion irradiation amount distribution $D_1(x)$ may be derived from the scanning speed distribution $S_0(x)$ and the ion irradiation amount distribution $D_0(x)$ based on the reference control waveform. For example, when the desired ion irradiation amount distribution $D_1(x)$ is set to a constant value, a uniform ion irradiation amount distribution which is not dependent on the position x may be obtained.

Hereinafter, a case will be described in which the adjusted ion irradiation amount distribution is adjusted to match the unadjusted average value $D_{ave}$. In the adjustment method, the ion irradiation amount distribution is adjusted so that the ion irradiation amount obtained by integrating the ion irradiation amount distribution in the beam scanning direction is the same before and after the adjustment. In addition, in the modified example, the ion irradiation amount distribution may be adjusted so that the unadjusted ion irradiation amount and the adjusted ion irradiation amount are different from each other.

Figure 6A:
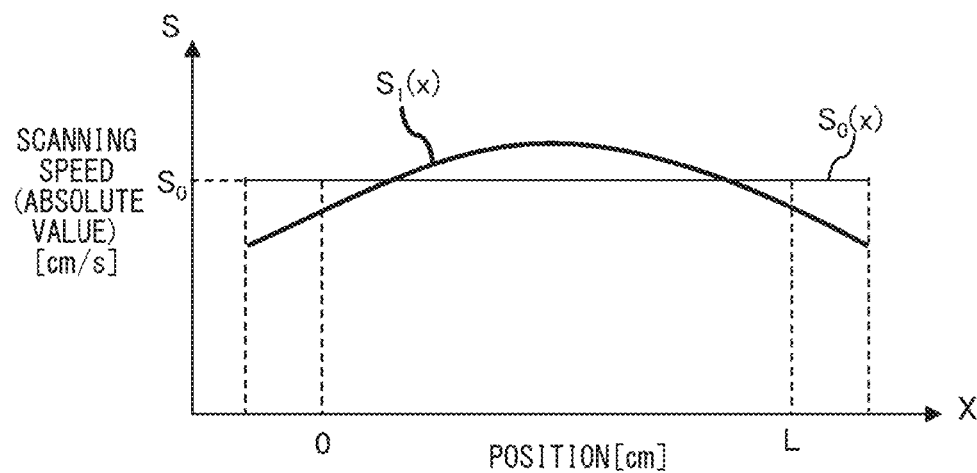
FIG. 6A is a graph illustrating an example of an adjusted scanning speed distribution and FIG. 6B is a graph illustrating an example of an adjusted ion irradiation amount distribution.
Figure 6B:
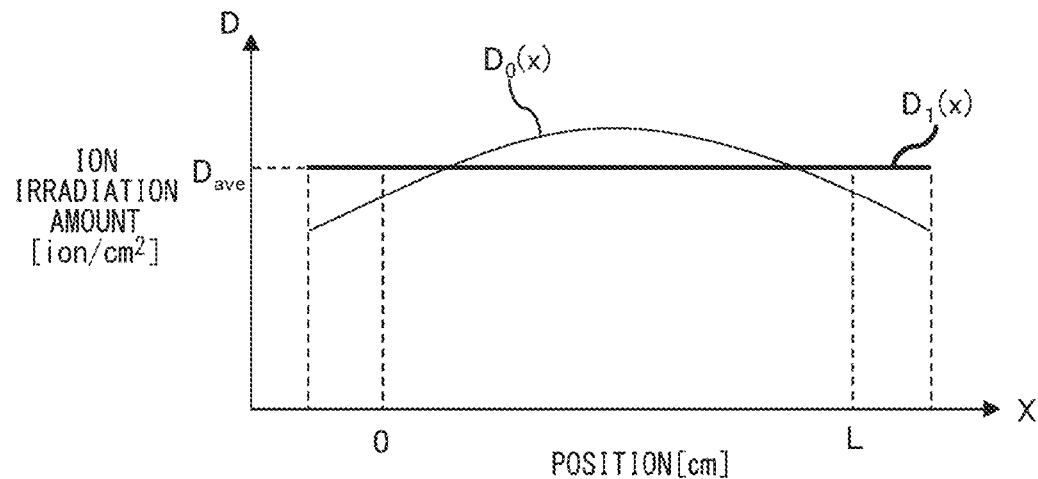

FIG. 6A is a graph illustrating an example of the adjusted scanning speed distribution $S_1(x)$, and FIG. 6B is a graph illustrating an example of the adjusted ion irradiation amount distribution $D_1(x)$. In either graph, the unadjusted distribution is indicated by the thin line, and the adjusted distribution is indicated by the thick line. As illustrated in FIG. 6A, the adjusted scanning speed distribution $S_1(x)$ has a shape similar to the unadjusted ion irradiation amount distribution $D_0(x)$. From the above-described relation, the relation of $S_1(x)=(S_0/D_{ave})*D_0(x)$ is satisfied. When the ion beam is scanned so as to obtain the scanning speed distribution $S_1(x)$ illustrated in FIG. 6A, a uniform ion irradiation amount distribution $D_1(x)$ which is equal to $D_{ave}$ illustrated in FIG. 6B may be obtained. In the present specification, the adjusted scanning speed distribution $S_1(x)$ is also referred to as the "second scanning speed distribution".

Figure 7:
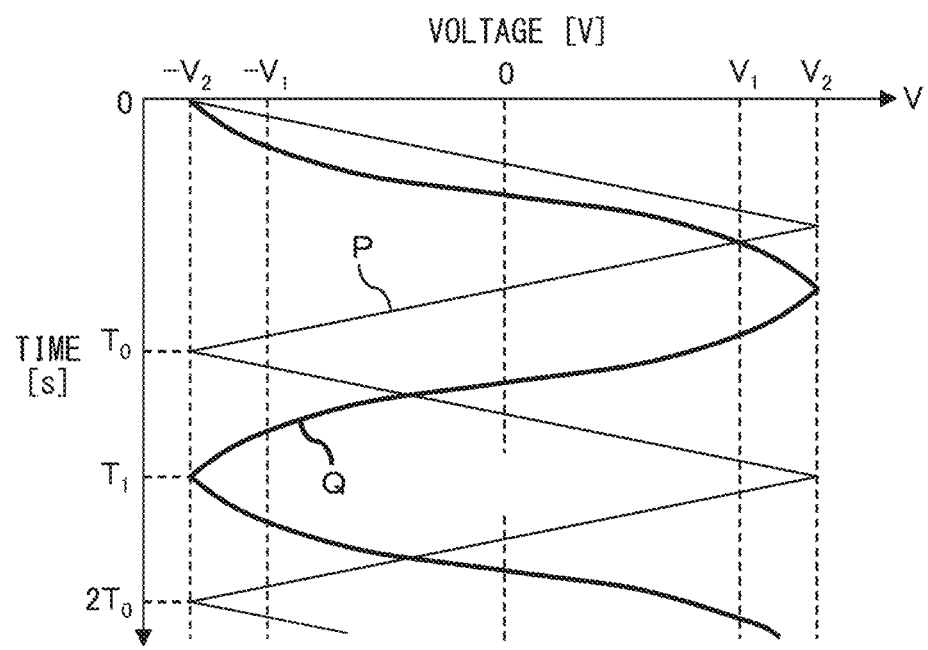
FIG. 7 is a graph illustrating an example of an adjusted control waveform for obtaining an adjusted scanning speed distribution.

FIG. 7 is a graph illustrating the adjusted control waveform Q for obtaining the adjusted scanning speed distribution $S_1(x)$. In FIG. 7, the unadjusted reference control waveform P is indicated by the thin line, and the adjusted control waveform Q is indicated by the thick line. The adjusted control waveform Q is a control waveform for realizing the adjusted scanning speed distribution $S_1(x)$, and may be obtained by integrating, for example, the adjusted scanning speed distribution $S_1(x)$ in time.

As illustrated in FIG. 6A, since the scanning speed distribution $S_1(x)$ has a shape in which the scanning speed is fast in the vicinity of the center of the irradiation area and is slow in the vicinity of both ends of the irradiation area, the adjusted control waveform Q becomes a voltage waveform in which the inclination at both ends is smaller and the inclination at the center is larger as illustrated in FIG. 7. As a result, a difference is generated between the scanning period $T_1$ of the adjusted control waveform Q and the scanning period $T_0$ of the reference control waveform P. In the example illustrated in FIG. 7, the scanning period $T_1$ of the adjusted control waveform Q becomes longer than the scanning period $T_0$ of the reference control waveform P.

When the scanning period changes, the ion irradiation amount distribution per unit time for the wafer W changes. As illustrated in FIG. 6B, the average value $D_{ave}$ of the ion irradiation amount distribution is the same before and after the adjustment. However, the ion irradiation amount distribution illustrated in FIG. 6B illustrates the ion irradiation amount for each scanning operation in a one-way manner. For that reason, the scanning period which is necessary for the irradiation of the ion beam of the same ion irradiation amount $D_{ave}$ extends from the unadjusted period $T_0$ to the adjusted period $T_1$ before and after the adjustment. As a result, the ion irradiation amount distribution $K(x)$ per unit time of the relation of $K(x)=D(x)/T$ obtained by dividing the ion irradiation amount distribution $D(x)$ by the period T changes before and after the adjustment. When the ion irradiation amount distribution per unit time changes, the result obtained by the ion implantation is influenced.

Here, in the embodiment, the scanning period is not changed before and after the adjustment so that the ion irradiation amount distribution $K(x)$ per unit time is not changed before and after the adjustment. Specifically, the scanning speed distribution in the irradiation area is set to a desired speed distribution, and the scanning speed distribution in the non-irradiation area is corrected to a distribution for matching the scanning period.

Figure 8A:
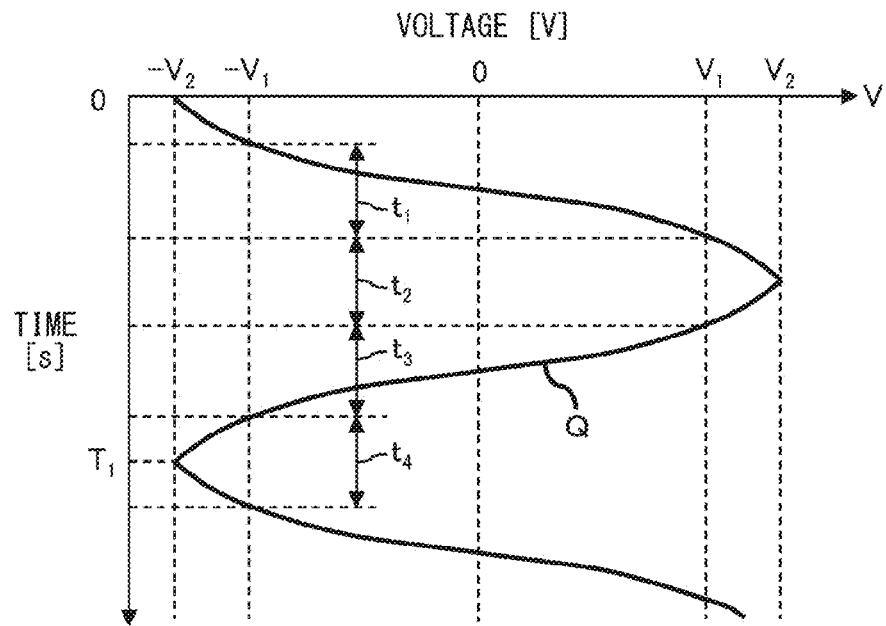
FIG. 8A is a graph illustrating an example of an uncorrected control waveform and FIG. 8B is a graph illustrating an example of a correction control waveform of which a scanning period is corrected.

FIG. 8A is a graph illustrating an example of the uncorrected control waveform Q, and is similar to the graph illustrating the example of the adjusted control waveform Q illustrated in FIG. 7. In FIG. 8A, the time corresponding to the scanning period $T_1$ for one reciprocating operation is divided into four zones, and the time values of the zones are set as $t_1$ to $t_4$. The time which is necessary for the first zone in which the scanning voltage changes from $-V_1$ to $V_1$ is set as $t_1$, and the time which is necessary for the second zone in which the scanning voltage returns to $V_1$ after the voltage changes from $V_1$ to $V_2$ is set as $t_2$. Further, the time which is necessary for the third zone in which the scanning voltage changes from $V_1$ to $-V_1$ is set as $t_3$, and the time which is necessary for the fourth zone in which the scanning voltage returns to $-V_1$ after the scanning voltage changes from $-V_1$ to $-V_2$ is set as $t_4$. The first zone and the third zone respectively correspond to the forward path and the backward path when the ion beam passes through the irradiation area. Thus, the time $t_1$ and the time $t_3$ which are necessary for the first zone and the third zone may be also referred to as the "irradiation time". Meanwhile, the second zone and the fourth zone correspond to the case where the ion beam passes through the non-irradiation area. Thus, the time $t_2$ and the time $t_4$ which are necessary for the second zone and the fourth zone may be also referred to as the "non-irradiation time". When the time $t_1$ to the time $t_4$ taken for the ion beam from the first zone to the fourth zone are summed, the summed time becomes the scanning period $T_1$ before the correction (after the adjustment). In addition, the time which is necessary for each zone may be obtained by the integration in each zone based on $\int ds/S_1(x)$ using the uncorrected (adjusted) scanning speed distribution $S_1(x)$.

Figure 8B:
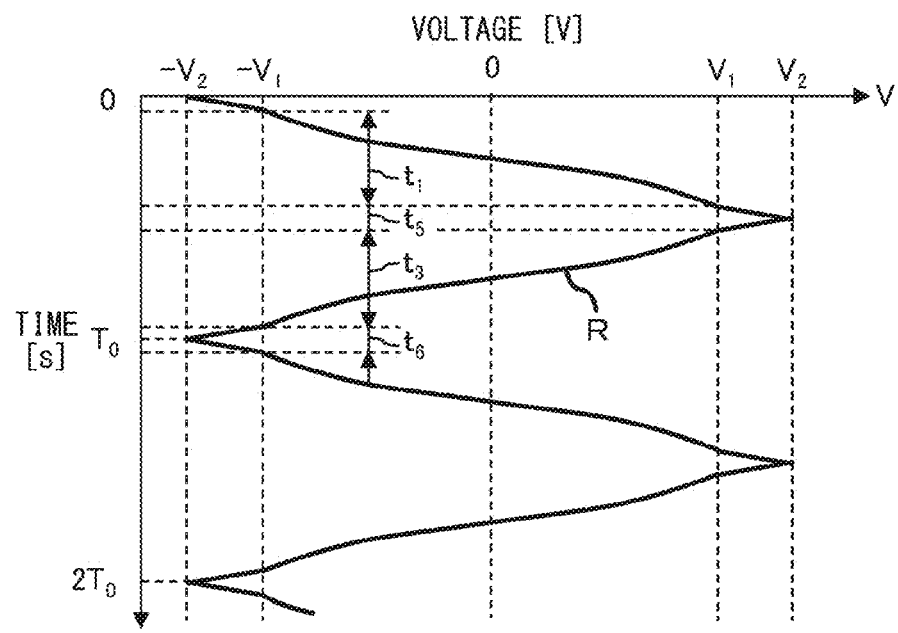

FIG. 8B is a graph illustrating an example of the correction control waveform R of which the scanning period is corrected. The correction control waveform R illustrated in FIG. 8B is a waveform similar to the uncorrected control waveform Q illustrated in FIG. 8A at the first zone and the third zone, and the control waveform is changed to a triangular wave at the second zone and the fourth zone. At this time, the non-irradiation time $t_5$ and the non-irradiation time $t_6$ which are necessary for the second zone and the fourth zone are corrected so that the sum of the irradiation time $t_1$ and the irradiation time $t_3$ which are necessary for the first zone and the third zone match the unadjusted scanning period $T_0$. In other words, the non-irradiation time $t_5$ and the non-irradiation time $t_6$ are set so as to satisfy the relation of $t_5+t_6=T_0-(t_1+t_3)$. When the correction control waveform R illustrated in FIG. 8B is corrected so as to match the unadjusted and adjusted scanning periods, the ion irradiation amount distribution per unit time may be the same before and after the adjustment.

Figure 9A:
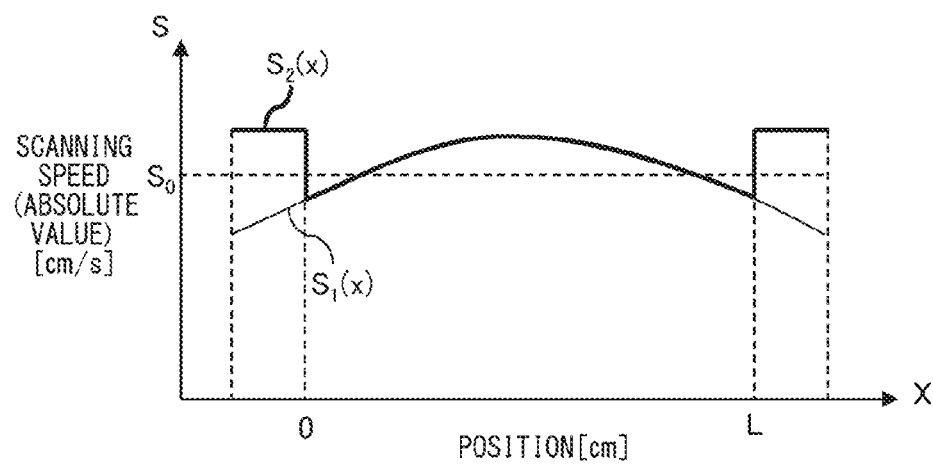
FIG. 9A is a graph illustrating an example of a scanning speed distribution of an ion beam scanned by the correction control waveform and FIG. 9B is a graph illustrating an example of an ion irradiation amount distribution of an ion beam scanned by the correction control waveform.

FIG. 9A is a graph illustrating an example of the scanning speed distribution of the ion beam scanned by the correction control waveform R. As illustrated in FIG. 9A, in the irradiation area, the scanning speed distribution $S_1(x)$ and the scanning speed distribution $S_2(x)$ before and after the correction are set to the same speed distribution. Meanwhile, in the non-irradiation area, the scanning speed distribution $S_1(x)$ and the scanning speed distribution $S_2(x)$ before and after the correction are different from each other. Specifically, only the speed distribution of the non-irradiation area becomes faster due to the correction in which the corrected scanning period $T_0$ becomes shorter than the uncorrected scanning period $T_1$.

Figure 9B:
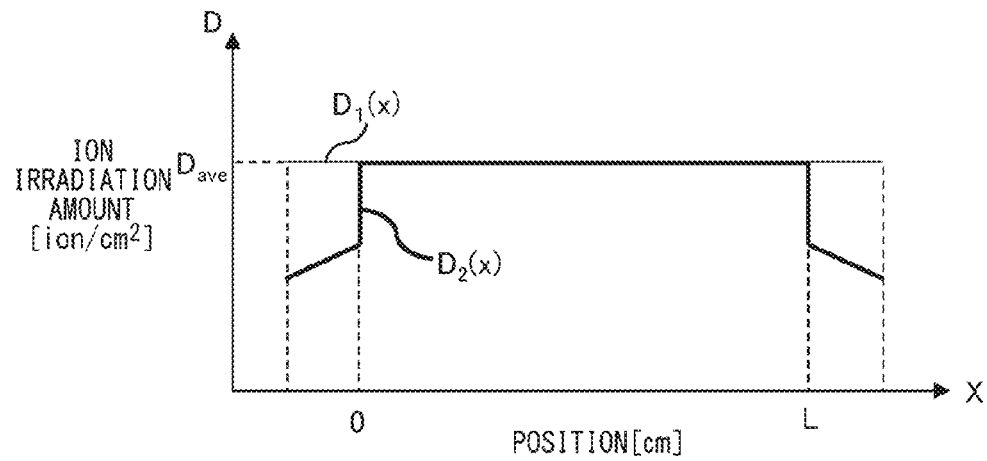

FIG. 9B is a graph illustrating an example of the ion irradiation amount distribution of the ion beam scanned by the correction control waveform R. As illustrated in FIG. 9A, since the scanning speed distribution is the same at the irradiation area before and after the correction, the ion irradiation amount distribution $D_1(x)$ and the ion irradiation amount distribution $D_2(x)$ are set to the same distribution. Accordingly, it is possible to irradiate the ion beam having a desired ion irradiation amount distribution to the wafer W by correcting the ion irradiation amount per unit time in the irradiation area. Meanwhile, since the scanning speed distribution changes in the non-irradiation area before and after the correction, the ion irradiation amount distribution $D_1(x)$ and the ion irradiation amount distribution $D_2(X)$ are different from each other. However, since the wafer W does not exist in the non-irradiation area, the ion irradiation amount distribution for the wafer W is not influenced even when the ion irradiation amount distribution in the non-irradiation area is any distribution. Thus, it is possible to control both the ion irradiation amount distribution and the ion irradiation amount per unit time by scanning the ion beam based on the correction control waveform R obtained as described above. Accordingly, it is possible to improve the quality of the ion implantation processing.

Figure 10:
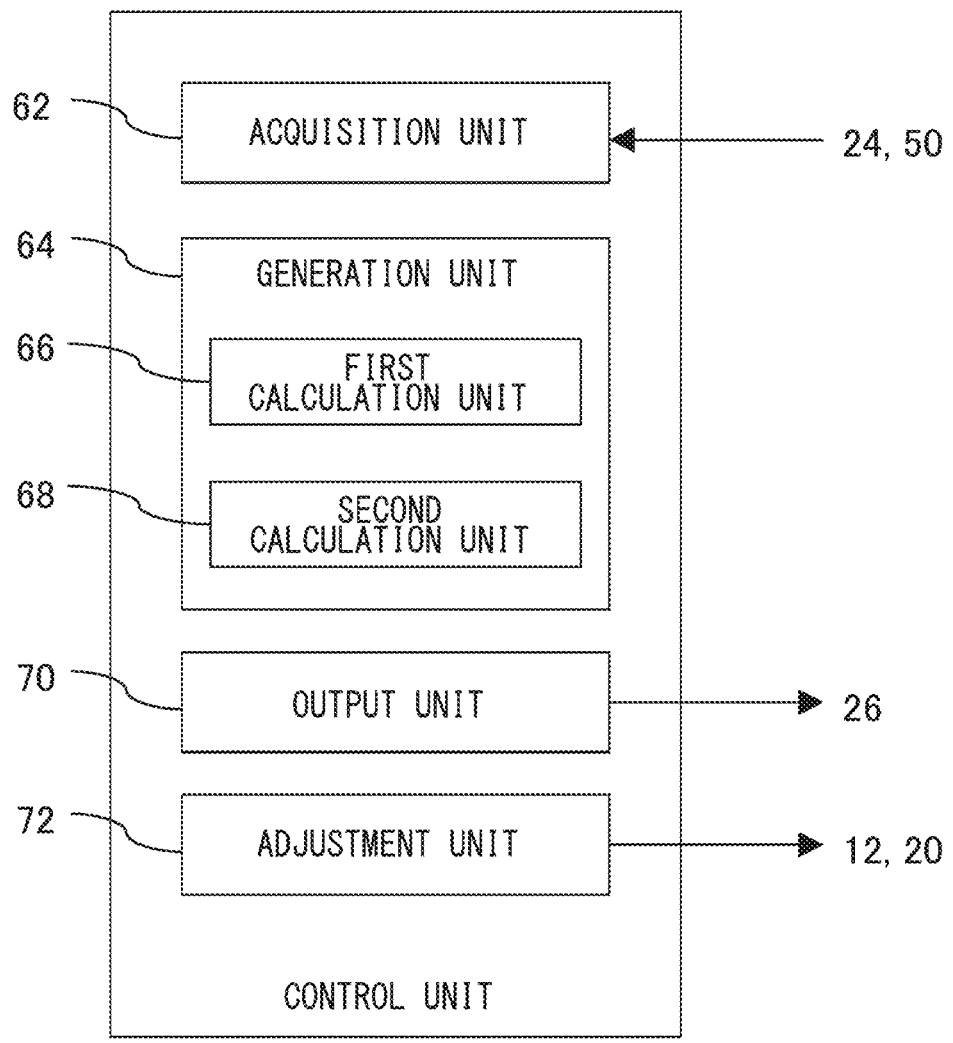
FIG. 10 is a block diagram illustrating the functional configuration of a control unit.

Subsequently, the configuration of the control unit 60 which generates the correction control waveform will be described. FIG. 10 is a block diagram illustrating the functional configuration of the control unit 60. The control unit 60 includes an acquisition unit 62, a generation unit 64, an output unit 70, and an adjustment unit 72. The generation unit 64 includes a first calculation unit 66 and a second calculation unit 68.

The blocks illustrated in the block diagram of the present specification are realized by components or mechanical devices using a CPU of a computer in hardware and are realized by a computer program or the like in software. However, the functional blocks herein are realized by the cooperation thereof. Thus, it is understood that the functional blocks are realized in various ways by the combination of hardware and software by the person skilled in the art.

The acquisition unit 62 acquires the value of the beam current amount from the first beam measurement unit 24 and acquires the value of the ion irradiation amount from the second beam measurement unit 50. The acquisition unit 62 may acquire the value of the ion irradiation amount at each position of the minute zones A1 to An illustrated in FIG. 4A as the array D[i] representing the ion irradiation amount distribution. The array D[i] (i=1 to n) may be the total ion irradiation amount of the ion which is input to each position of the minute zones A1 to An while the ion beam is scanned for one reciprocating scanning operation or may be the total irradiation amount while the ion beam is scanned for plural reciprocating scanning operations. Further, the total irradiation amount for one reciprocating scanning operation obtained by dividing the total irradiation amount for plural reciprocating scanning operations by the number of times of the scanning operations may be acquired as the array D[i]. In addition, in the embodiment, the value corresponding to the total irradiation amount for one reciprocating scanning operation is set as the value of the array D[i] of the ion irradiation amount distribution.

The first calculation unit 66 calculates the array $S_1[i]$ of the second scanning speed distribution by using the array $S_0[i]$ of the first scanning speed distribution corresponding to the reference control waveform, the array $D_0[i]$ of the ion irradiation amount distribution acquired by the acquisition unit 62, and the array $D_1[i]$ of the target ion irradiation amount distribution. The first calculation unit 66 calculates the array $S_1[i]$ of the second scanning speed distribution by using the relation of $S_1[i]=S_0[i]*D_0[i]/D_1[i]$. In addition, in the embodiment, the value corresponding to the speed distribution for each one-way scanning operation is set as the value of the array S[i] of the scanning speed distribution. Further, in the embodiment, the ion beam is scanned so that the same scanning speed distribution is obtained in the forward path and the backward path of each reciprocating scanning operation. In addition, in the modified example, the array S[i] that separately stores the scanning speed distribution values of the forward path and the backward path may be used.

Here, the array $S_0[i]$ of the first scanning speed distribution indicates a change in time of the beam position of each of the minute zones A1 to An when the ion beam is scanned based on the reference control waveform. The array $S_0[i]$ of the first scanning speed distribution may be stored in a storage unit (not illustrated) of the control unit 60 or may be acquired from the second beam measurement unit 50 based on the measurement result using the center cup 42. The array $D_0[i]$ of the ion irradiation amount distribution indicates the ion irradiation amount distribution which is measured by the center cup 42 when the ion beam is scanned based on the reference control waveform. Further, the array $D_1[i]$ of the target ion irradiation amount distribution may be acquired by the input of the input unit (not illustrated) of the control unit 60 or may be stored in advance in the storage unit of the control unit 60.

The second calculation unit 68 calculates a corrected scanning period $T_{tgt}$ by using the array $D_1[i]$ of the target ion irradiation amount distribution and the target value $K_{tgt}$ of the ion irradiation amount per unit time. First, the second calculation unit 68 calculates the average value $D_{ave}$ of the array $D_1[i]$ of the target ion irradiation amount distribution. The average value $D_{ave}$ may be obtained by adding the values of the array $D_1[i]$ in the range in which i is 1 to n and dividing the value by the division number n. Next, the corrected scanning period $T_{tgt}$ is calculated by the relation of $K_{tgt}=D_{ave}/T_{tgt}$ and $T_{tgt}=D_{ave}/K_{tgt}$.

Subsequently, the second calculation unit 68 calculates the irradiation time $t_1$ and the irradiation time $t_3$ which are necessary for the case where the ion beam scans the irradiation area $C_1$ in an one-way manner by using the array $S_1[i]$ of the second scanning speed distribution. The irradiation time $t_1$ and the irradiation time $t_3$ correspond to the time $t_1$ and the time $t_3$ illustrated in FIGS. 8A and 8B. The time in which the ion beam passes through a certain minute zone Ai is expressed by $1/S_1[i]*(L/n)$ on the assumption that the width dx of the minute zone Ai is L/n. Thus, the irradiation time $t_1$ and the irradiation time $t_3$ may be obtained by adding the values in the range in which i is 1 to n.

Subsequently, the second calculation unit 68 calculates the non-irradiation time $t_5$ and the non-irradiation time $t_6$ in which the ion beam is located at the non-irradiation area C2. The non-irradiation time $t_5$ and the non-irradiation time $t_6$ correspond to the time $t_5$ and the time $t_6$ illustrated in FIG. 8B. The value obtained by adding the non-irradiation time $t_5$ and the non-irradiation time $t_6$ may be calculated by the equation of $t_5+t_6=T_{tgt}-(t_1+t_3)$. When the time $t_5$ and the time $t_6$ are set to be the same in the non-irradiation area C2, the non-irradiation time $t_5$ and the non-irradiation time $t_6$ may be obtained by halving the total time.

The generation unit 64 generates the correction control waveform by using the values calculated by the first calculation unit 66 and the second calculation unit 68. The generation unit 64 generates the correction control waveform illustrated in FIG. 8B by using the array $S_1[i]$ of the second scanning speed distribution calculated by the first calculation unit 66 and the non-irradiation time $t_5$ and the non-irradiation time $t_6$ calculated by the second calculation unit 68. For example, the generation unit 64 may at least have a digital/analog (D/A) converter capable of performing a high-speed process.

The output unit 70 outputs the reference control waveform stored in the control unit 60 and/or the correction control waveform generated by the generation unit 64 to the beam scanner 26. When a predetermined control waveform is output to the beam scanner 26, the ion beam is scanned based on the output control waveform.

The adjustment unit 72 adjusts the beam current amount $I_B$ of the ion beam by controlling the beam current adjustment unit provided at the upstream side of the beam scanner 26. The adjustment unit 72 controls the ion source 12 or the variable aperture 20 as the beam current adjustment unit. The adjustment unit 72 adjusts the beam current amount $I_B$ at the upstream side by changing the output of the ion source 12 or changing the aperture width of the variable aperture 20.

The adjustment unit 72 increases the ion input amount G per unit time by increasing the beam current amount $I_B$ at the upstream side, for example, when the non-irradiation time $t_5$ and the non-irradiation time $t_6$ calculated by the second calculation unit 68 become negative values. When the ion irradiation amount K per unit time is adjusted by adjusting the control waveform, the ion irradiation amount K per unit time may be increased by decreasing the scanning period T and increasing the repeating frequency of the beam scanning. However, when the second scanning speed distribution is determined in order to obtain the desired ion irradiation amount distribution D, the scanning period T cannot be shorter than the total value of $t_1+t_3$ since the irradiation time $t_1$ and the irradiation time $t_3$ are also determined. Here, the adjustment unit 72 may obtain both the second scanning speed distribution and the corrected scanning period in a compatible state by increasing the ion input amount G per unit time in accordance with the adjustment of the beam current amount $I_B$ at the upstream side.

Thus, it may be mentioned that the adjustment unit 72 has a function of coarsely adjusting the ion beam so that the ion irradiation amount per unit time becomes close to the target value by the adjustment of the beam current amount at the upstream side. Meanwhile, it may be mentioned that the generation unit 64 has a function of precisely adjusting the ion beam so that the ion irradiation amount per unit time becomes the target value by the generation of the correction control waveform.

Figure 11A:
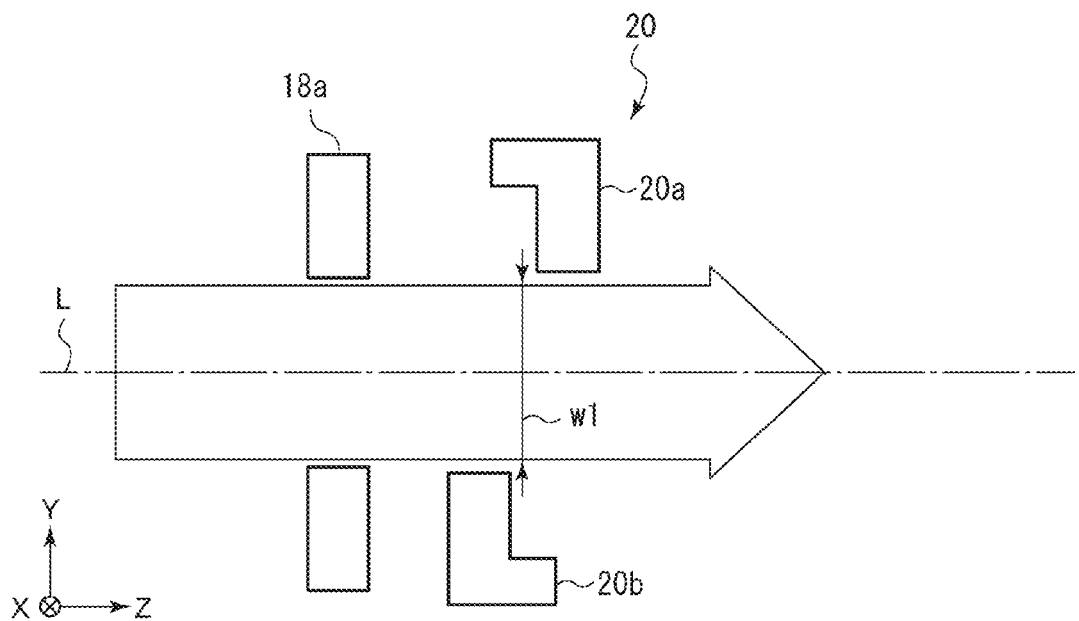
FIGS. 11A and 11B are schematic views illustrating a variable aperture.
Figure 11B:
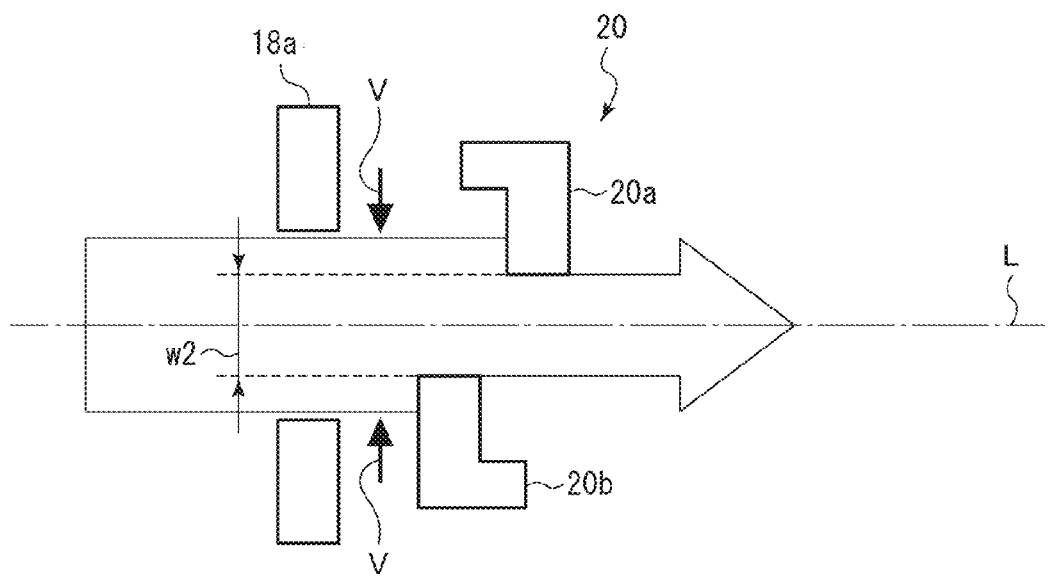

FIGS. 11A and 11B are schematic views illustrating the variable aperture 20 according to the embodiment. FIG. 11A illustrates a state where the variable aperture 20 is opened, and FIG. 11B illustrates a state where the variable aperture 20 is closed by a certain degree. In these drawings, the position of a mass analyzing slit 18a provided at the exit of the mass analyzing unit 18 is also illustrated.

The variable aperture 20 includes a pair of aperture plates 20a and 20b movable in the Y direction. The pair of aperture plates 20a and 20b is adapted to move symmetrically with respect to the horizontal plane including a center path L as indicated by the arrow V of the drawing, and the aperture plates 20a and 20b are provided with a driving unit (not illustrated) therefor. When one aperture plate 20a moves by a certain length in the −Y direction so as to approach the center path L, the other aperture plate 20b also moves by the length in the +Y direction so as to approach the center path L. In this way, the pair of aperture plates 20a and 20b moves by the same distance in the opposite directions. Accordingly, the beam current amount of the ion beam passing through the aperture is adjusted by changing the aperture width from w1 to w2.

In addition, the variable aperture 20 may be, for example, a continuously variable aperture (CVA). One configuration example of the CVA is disclosed in, for example, JP 2000-243341 A and JP 2000-243342 A, and the entirety of these cited documents are used as reference in the present specification. By using the CVA, the beam current amount may be precisely adjusted at the upstream side.

An operation of the ion implantation apparatus 10 with the above-described configuration will be described.

Figure 12:
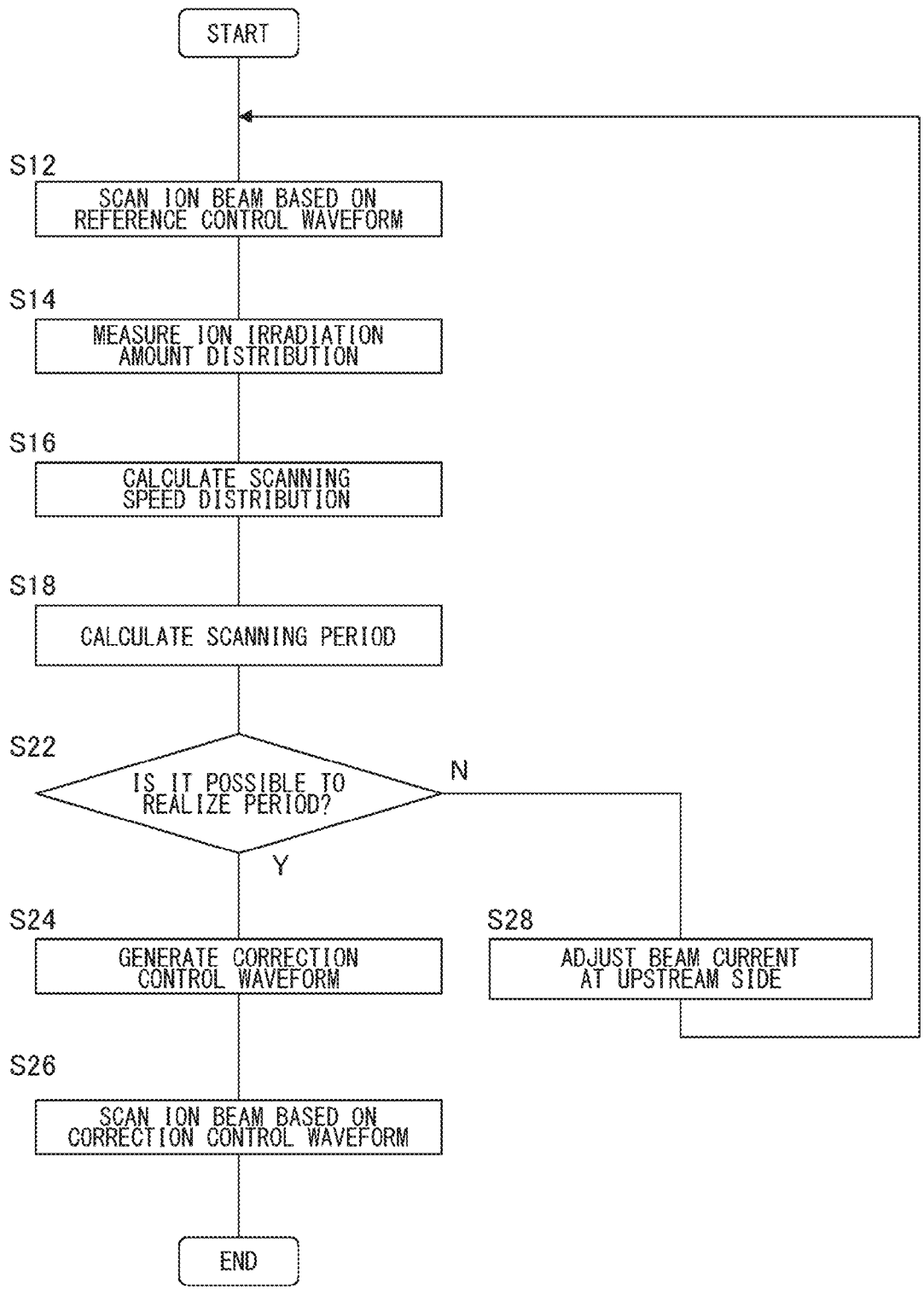
FIG. 12 is a flowchart illustrating the operation procedure of the ion implantation apparatus according to the embodiment.

FIG. 12 is a flowchart illustrating the operation procedure of the ion implantation apparatus 10. The ion beam is scanned based on the reference control waveform (S12), and the ion irradiation amount distribution is measured (S14). The scanning speed distribution is calculated in accordance with the measured ion irradiation amount distribution and the target ion irradiation amount distribution (S16), and the scanning period is calculated so that the beam current value becomes the target value (S18). When the calculated scanning period may be realized (Y of S22), the correction control waveform capable of realizing the calculated scanning speed distribution and the scanning period are generated (S24), and the ion beam is scanned based on the correction control waveform (S24). When the calculated scanning period cannot be realized (N of S22), the beam current amount is adjusted at the upstream side (S28), and the steps S12 to S22 are performed.

While the invention has been described with reference to the above-described embodiments, the invention is not limited to the above-described embodiments, and appropriate combinations or substitutions of the embodiments are also included in the invention. Further, the combinations or the process sequences of the embodiments may be appropriately changed or various modifications such as a change in design may be made in the embodiments based on the knowledge of the person skilled in the art. Then, the embodiments modified in that way are also included in the scope of the invention.

Modified Example 1

Figure 13A:
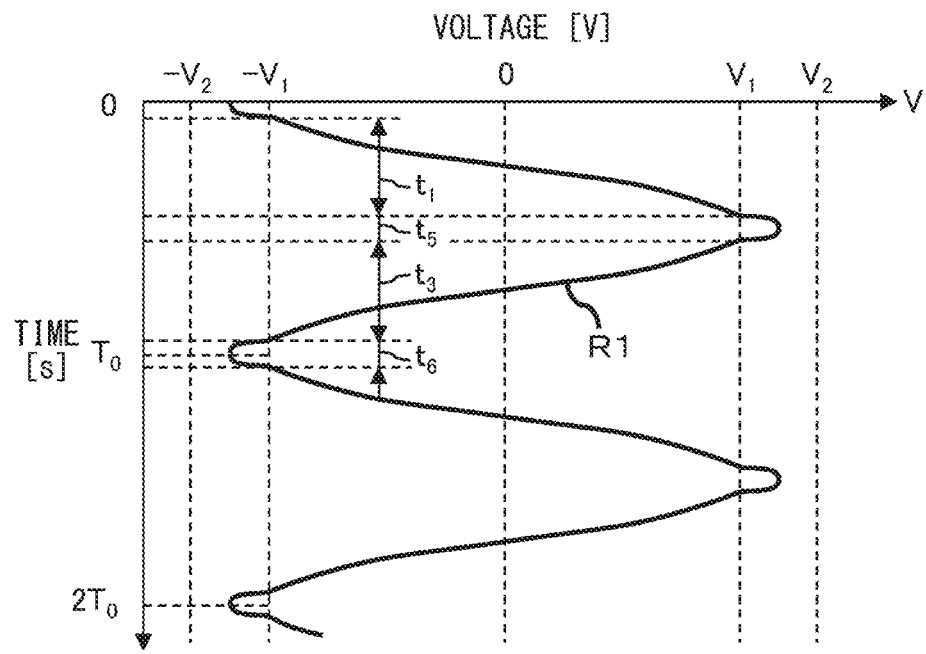
FIGS. 13A and 13B are graphs illustrating an example of a correction control waveform according to a modified example.
Figure 13B:
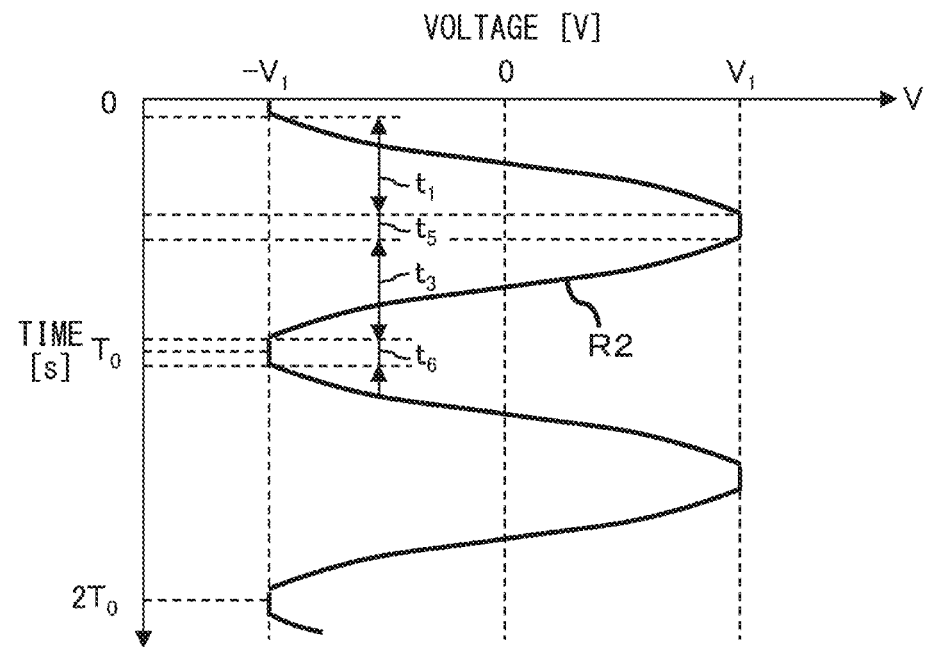

FIGS. 13A and 13B are graphs illustrating examples of the correction control waveforms R1 and R2 according to the modified example and illustrating an example of the control waveform corresponding to the correction control waveform R illustrated in FIG. 8B. As in the correction control waveform R1 illustrated in FIG. 13A, the waveforms of the non-irradiation time $t_5$ and the non-irradiation time $t_6$ are not needed to be triangular waves and may be curves having an arbitrary shape. Further, as in the correction control waveform R2 illustrated in FIG. 13B, a voltage may be fixed to the first voltage $V_1$ (or $-V_1$) for the non-irradiation time $t_5$ and the non-irradiation time $t_6$. In this case, the ion beam is located at the end of the irradiation area for the non-irradiation time $t_5$ and the non-irradiation time $t_6$ so that the scanning operation is temporarily stopped. Even in such a control waveform, the same effects as the above-described embodiments may be obtained. In a further modified example, a voltage higher than the first voltage $V_1$ (or $-V_1$) may be fixed for the non-irradiation time $t_5$ and the non-irradiation time $t_6$.

Modified Example 2

Figure 14:
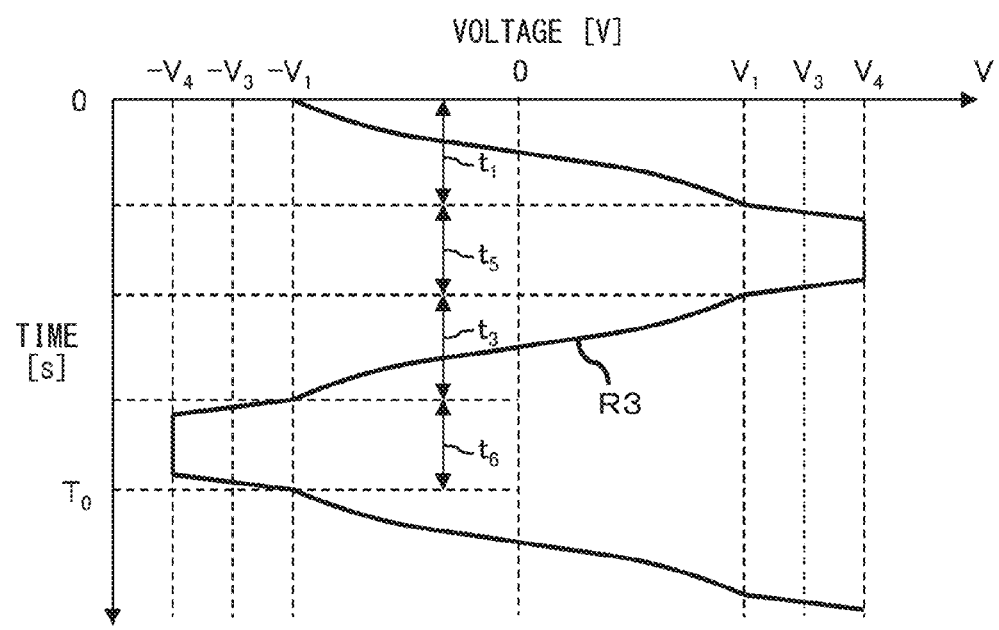
FIG. 14 is a graph illustrating an example of a correction control waveform according to a modified example.

FIG. 14 is a graph illustrating an example of the correction control waveform R3 according to the modified example. In the control waveform illustrated in FIG. 14, a voltage is fixed to the fourth voltage $V_4$ (or $-V_4$) higher than the third voltage $V_3$ (or $-V_3$) for the non-irradiation time $t_5$ and the non-irradiation time $t_6$. Here, the third voltage $V_3$ corresponds to a voltage in which the ion beam is located at the side measurement position C3 illustrated in FIG. 3, and the fourth voltage $V_4$ corresponds to a voltage in which the ion beam is located at the scanning end position C4. In this way, since the ion beam is scanned so that the ion beam is located at the side measurement position C3, the ion irradiation amount per unit time may be measured by the side cups 40R and 40L even during the ion implantation processing. Accordingly, it is possible to handle a case where the ion irradiation amount per unit time changes during the ion implantation processing. Further, since the scanning operation of the ion beam is temporarily stopped at the scanning end position C4, the beam directed to the non-irradiation area may be interrupted by the protective plates 46R and 46L. Accordingly, even when the ion beam is over-scanned up to the non-irradiation area C2, it is possible to prevent a problem in which the ion beam is irradiated to an unexpected position inside the implantation processing chamber 16, and hence to improve the stability of the ion implantation processing.

Modified Example 3

Figure 15:
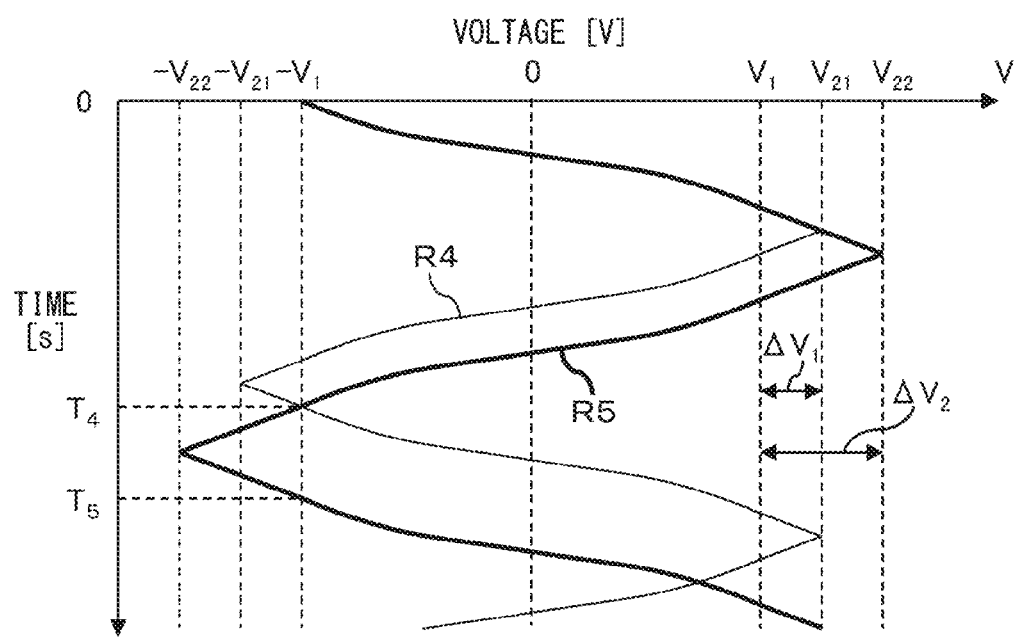
FIG. 15 is a graph illustrating an example of a correction control waveform according to a modified example.

FIG. 15 is a graph illustrating examples of the correction control waveforms R4 and R5 according to the modified example. FIG. 15 schematically illustrates a method for adjusting the non-irradiation time by changing the scanning width in the non-irradiation area. The correction control waveform R4 of the period $T_4$ indicated by the thin line and the correction control waveform R5 of the period $T_5$ indicated by the thick line have the same waveform in the irradiation area. Further, the inclination $dV/dt$ corresponding to a change value in time of the waveform in the non-irradiation area is the same, and the scanning speed in the non-irradiation area is the same. In such a condition, the scanning period is adjusted by changing the voltages $\Delta V1$ and $\Delta V2$ corresponding to the scanning width of the non-irradiation area. In this way, it is possible to adjust the scanning period only by changing the scanning width while the scanning speed in the non-irradiation area is constant. Accordingly, it is possible to adjust the ion irradiation amount per unit time without changing the ion irradiation amount distribution in the irradiation area.

Modified Example 4

In the above-described embodiments, the ion irradiation amount distribution based on the reference control waveform is measured, and the correction control waveform is generated by performing both the calculation for correcting the scanning speed distribution and the calculation for correcting the scanning period. In the modified example, the first calculation unit 66 calculates the second scanning speed distribution, and the generation unit 64 generates the intermediate control waveform corresponding to the second scanning speed distribution. Subsequently, the ion irradiation amount distribution per unit time is measured by scanning the ion beam based on the intermediate control waveform, and the corrected scanning period is calculated by using the measured ion irradiation amount distribution per unit time.

For example, the generation unit 64 generates the adjusted control waveform Q indicated by the thick line of FIG. 7 as the intermediate control waveform, and the output unit 70 outputs the intermediate control waveform to the beam scanner 26. At this time, the ion irradiation amount distribution $D_1(x)$ of the ion beam scanned by the intermediate control waveform becomes a desired distribution, but the ion irradiation amount distribution per unit time is deviated from the target value. The corrected scanning period is calculated and the correction control waveform is generated by measuring the ion irradiation amount distribution per unit time deviated from the target value. In the modified example, the steps of generating and outputting the intermediate control waveform are additionally provided, but both the ion irradiation amount distribution and the ion irradiation amount per unit time may be controlled similarly to the above-described embodiments. Further, the adjustment precision of the ion irradiation amount distribution per unit time may be improved by measuring the ion irradiation amount distribution per unit time using the intermediate control waveform.

Modified Example 5

In the above-described embodiments, described is a method for adjusting the beam current amount $I_B$ by controlling the beam current adjustment unit when the corrected scanning period cannot be realized. In the modified example, the beam current amount is adjusted in advance at the upstream side before the ion beam is scanned by the reference control waveform. When the beam current amount is adjusted by using the variable aperture 20, the beam current amount may be easily decreased by narrowing the aperture width. However, the beam current amount cannot be increased from the state where the aperture width is maximal. In this case, when the output of the ion source 12 is not increased, the beam current amount cannot be increased, and the ion irradiation amount distribution per unit time cannot be increased. However, the output of the ion source 12 is not easily adjusted in a short time and a certain degree of time needs to be ensured for the stabilization after the output is adjusted. Further, there is a need to change the setting of each of the devices constituting the beam line device 14 when the output of the ion source 12 is changed. Thus, when the output of the ion source 12 is adjusted to increase the beam current amount, it takes time for the adjustment. Then, the efficiency of the ion implantation apparatus 10 is degraded, and hence the production efficiency for the semiconductor device may be influenced.

Here, in the modified example, the ion irradiation amount per unit time is coarsely adjusted by adjusting the beam current amount at the upstream side before the ion irradiation amount distribution is adjusted. At this time, the beam current amount of the ion beam is adjusted so that the ion input amount per unit time increases compared to the target value of the ion irradiation amount per unit time. The ion irradiation amount per unit time may be easily decreased by changing the shape of the correction control waveform, but there is a limitation in the operation of increasing the ion irradiation amount per unit time after the beam current amount is largely adjusted at the upstream side. Subsequently, the ion irradiation amount per unit time for the irradiation area is precisely adjusted by adjusting the scanning period in accordance with the adjustment of the shape of the correction control waveform. In this way, it is possible to shorten the adjustment time by adjusting the beam current amount at the upstream side in advance. Meanwhile, there is a case where it is difficult to adjust the ion irradiation amount per unit time with high precision only at the upstream side. Here, the ion irradiation amount per unit time of the ion beam irradiated to the wafer W is precisely adjusted by adjusting the shape of the correction control waveform. In this way, it is possible to widen the adjustable range and to adjust the ion irradiation amount per unit time with high precision by the combination of the coarse adjustment at the upstream side and the precise adjustment at the beam scanner.

In addition, there is a need to set the operation condition of the ion source 12 or the beam line device 14 when the ion implantation apparatus 10 is activated or the implantation condition for the wafer W is changed, and hence an operation of adjusting the beam current amount at the upstream side is generally performed. Here, when the ion beam is coarsely adjusted so that the ion irradiation amount distribution per unit time becomes close to the target value during the general adjustment of the beam current amount, it is possible to coarsely adjust the ion irradiation amount per unit time without an additional adjustment operation. Accordingly, it is possible to decrease the number of adjustment steps and to improve the efficiency of the apparatus.

In addition, it is possible to increase the beam current amount by a certain degree at the upstream side by preparing a table set in response to the target ion irradiation amount per unit time and to determine the beam current amount at the upstream side with reference to the table. Further, the coarsely adjusted ion irradiation amount per unit time may be determined by the input from the input unit of the control unit 60.

Modified Example 6

Figure 16A:
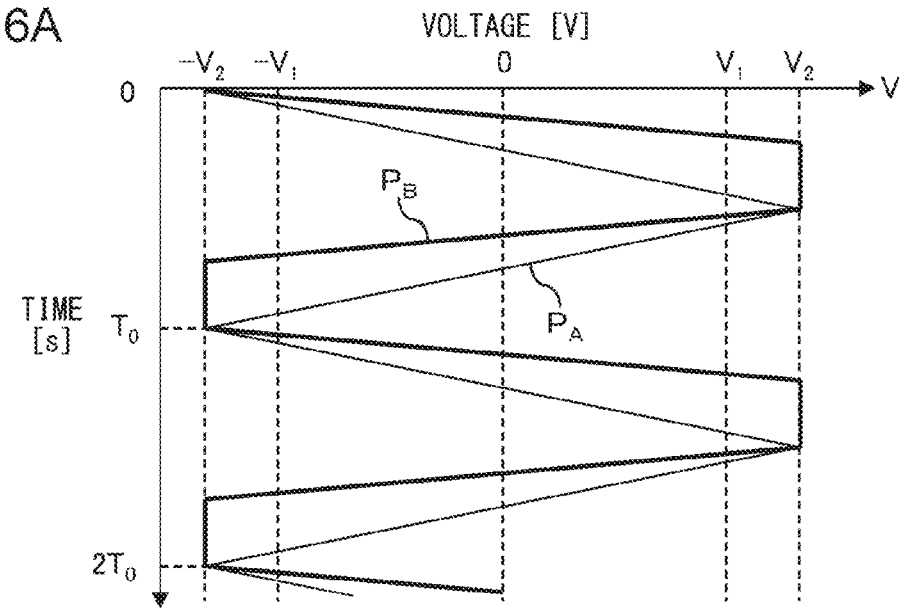
FIG. 16A is a graph illustrating an example of a reference control waveform according to a modified example.
Figure 16B:
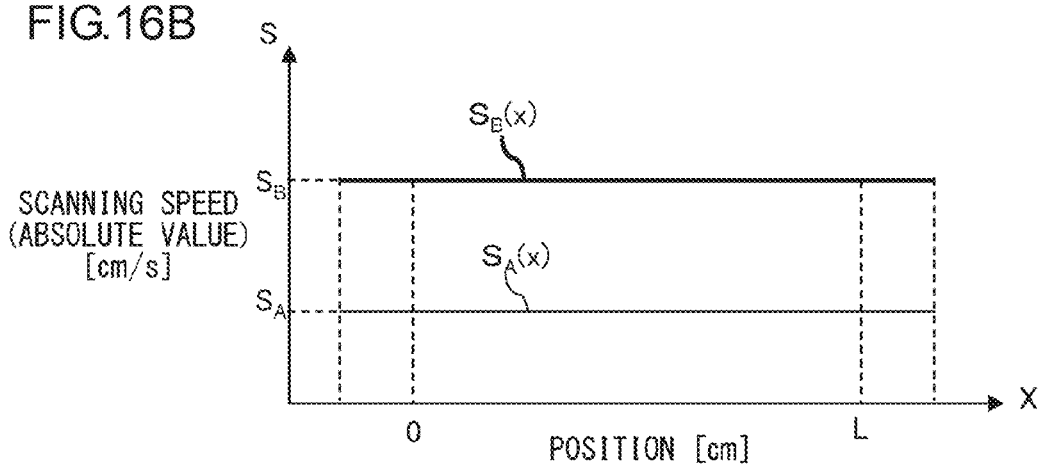
FIG. 16B is a graph illustrating an example of a scanning speed distribution of an ion beam scanned by the reference control waveform according to the modified example.
Figure 16C:
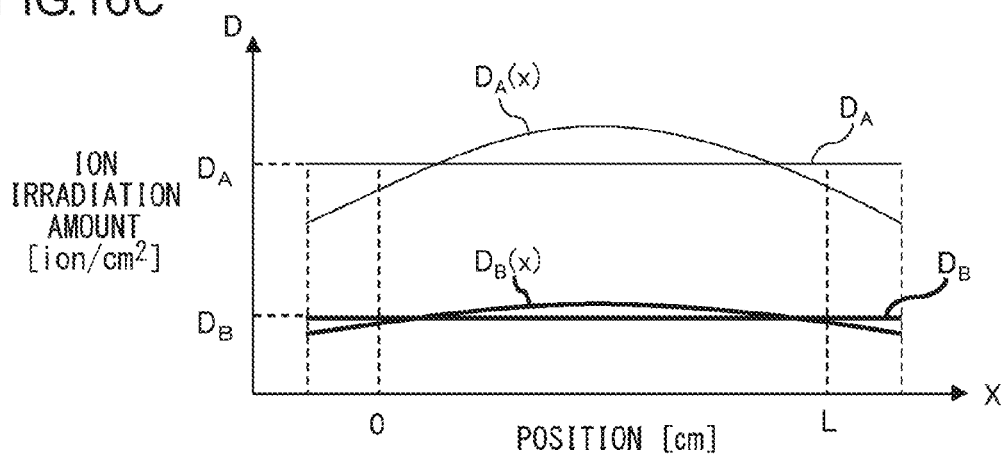
FIG. 16C is a graph illustrating an example of an ion irradiation amount distribution of the ion beam scanned by the reference control waveform according to the modified example.

In the modified example, the reference control waveform of which the adjustable range is increased will be described. FIG. 16A is a graph illustrating an example of the reference control waveform $P_B$ according to the modified example. FIG. 16B is a graph illustrating an example of the scanning speed distribution $S_B(x)$ of the ion beam scanned by the reference control waveform $P_B$ according to the modified example. FIG. 16C is a graph illustrating an example of the ion irradiation amount distribution $D_B(x)$ of the ion beam scanned by the reference control waveform $P_B$ according to the modified example. In all drawings, the graph corresponding to the reference control waveform $P_A$ equal to the reference control waveform P illustrated in FIG. 5A is indicated by the thin line, and the graph corresponding to the reference control waveform $P_B$ according to the modified example is indicated by the thick line. In the modified example, the scanning speed distribution becomes fast from $S_A$ to $S_B$ as illustrated in FIG. 16B and the non-irradiation time becomes long as illustrated in FIG. 16A, so that the reference control waveform B and the reference control waveform A according to the modified example have the same period $T_0$.

At this time, as illustrated in FIG. 16C, when the beam current amount is the same at the upstream side, the ion irradiation amount distribution $D_B(x)$ corresponding to the reference control waveform $P_B$ according to the modified example has a small distribution as a whole compared to the ion irradiation amount distribution $D_A(x)$ corresponding to the reference control waveform $P_A$. Then, if the beam current amount $I_B$ is increased at the upstream side when the ion beam is scanned based on the reference control waveform $P_B$ according to the modified example, the ion irradiation amount distribution may be equal to the ion irradiation amount distribution $D_A(X)$. For example, if the beam current amount $I_B$ at the upstream side is set to $D_A/D_B$ times when the average value of the ion irradiation amount distribution corresponding to the reference control waveform $P_A$ is set to $D_A$ and the average value of the ion irradiation amount distribution corresponding to the reference control waveform $P_B$ according to the modified example is set to $D_B$, the ion irradiation amount distribution $D_A(x)$ may be realized by using the reference control waveform $P_B$ according to the modified example. At this time, since the reference control waveform $P_A$ and the reference control waveform $P_B$ according to the modified example have the same scanning period $T_0$, the ion irradiation amount distribution per unit time is also the same.

That is, in the modified example, even when the reference control waveform $P_B$ having a large ratio of the non-irradiation time is used, the beam current value $I_B$ is coarsely adjusted at the upstream side so that the ion irradiation amount per unit time becomes close to the target value. Since the reference control waveform $P_B$ according to the modified example have a long non-irradiation time, the scanning period of the reference control waveform $P_B$ may be set to the desired value even when the irradiation time corresponding to the calculated scanning speed distribution $S_B$ is slightly long. In other words, when the corrected scanning period is calculated, the range capable of realizing the scanning period is widened. As a result, the adjustable range may be widened compared to the case where the reference control waveform $P_A$ is used. When the ion beam is coarsely adjusted at the upstream side so that the ion irradiation amount per unit time obtained when the reference control waveform $P_B$ and the reference control waveform $P_B$ are used becomes close to the target value, the ion irradiation amount distribution and the ion irradiation amount per unit time may be further smoothly controlled. Further, since the beam current amount is coarsely adjusted in advance at the upstream side, it is possible to shorten the time taken for the adjustment.

Modified Example 7

In the above-described embodiments, the second scanning speed distribution is calculated so as to have the same average value $D_{ave}$ of the ion irradiation amount distribution for one reciprocating scanning operation, and the corrected scanning period is set to be equal to the uncorrected scanning period $T_0$, so that the average value in time of the beam current before and after the correction is the same. In a further modified example, the second scanning speed distribution may be calculated under the condition in which the first ion irradiation amount distribution and the second ion irradiation amount distribution have different average values. Further, the correction control waveform may be generated by calculating the corrected scanning period under the condition in which the ion irradiation amount per unit time before and after the correction have a different value. Even in such a condition, the ion beam may be scanned so that the ion irradiation amount distribution and the ion irradiation amount per unit time become predetermined values.

Modified Example 8

Figure 17A:
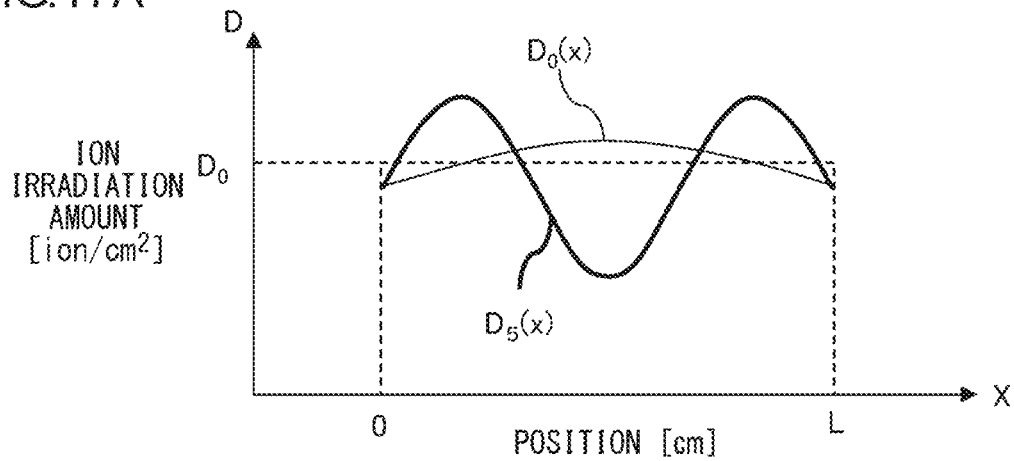
FIG. 17A is a graph illustrating an example of an ion irradiation amount distribution having a non-uniform shape.

In the above-described embodiments, a case is described in which the ion irradiation amount distribution is corrected so as to be uniform. In the modified example, the ion irradiation amount distribution may be corrected so as to have an arbitrary non-uniform shape. FIG. 17A is a graph illustrating an example of the ion irradiation amount distribution $D_S(x)$ having a non-uniform shape. In the modified example, the ion irradiation amount distribution is set to a target distribution in which the ion irradiation amount at the center and both ends is smaller and the ion irradiation amount at the intermediate region between the center and both end is larger. With such a distribution, the adjusted scanning speed distribution $S_5(x)$ may be set to a distribution that satisfies the relation of $S_5(x)=S_0(x)*D_0(x)/D_5(x)$.

Figure 17B:
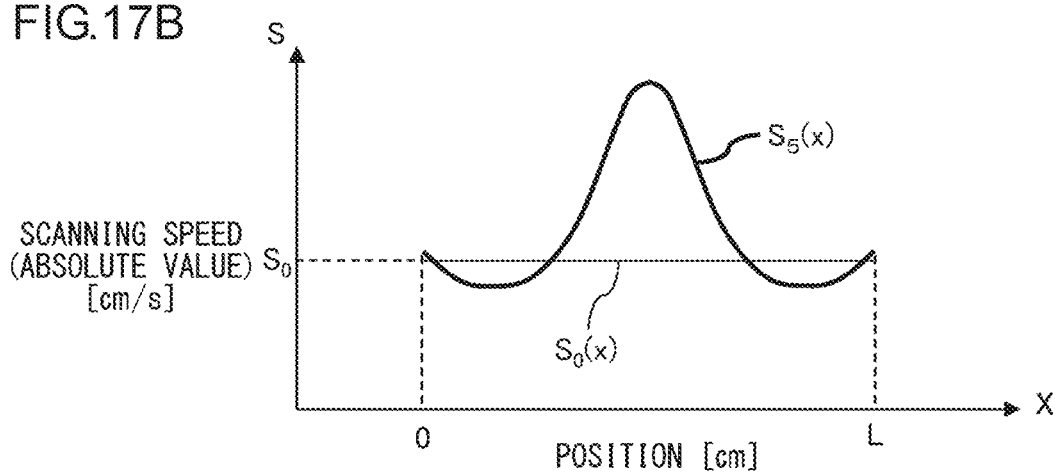
FIG. 17B is a graph illustrating an example of a scanning speed distribution of an ion beam that realizes the ion irradiation amount distribution having a non-uniform shape.

FIG. 17B is a graph illustrating an example of the scanning speed distribution $S_5(x)$ of the ion beam that realizes the ion irradiation amount distribution having a non-uniform shape. As illustrated in the drawings, the scanning speed distribution $S_5(x)$ has a speed distribution in which the scanning speed at the center is increased to decrease the ion irradiation amount at the center and the scanning speed at the intermediate region between the center and both end is decreased to increase the ion irradiation amount at the intermediate region between the center and both end. In addition, the scanning speed distribution $S_5(x)$ also includes a component that forms a uniform shape of the uncorrected ion irradiation amount distribution $D_0(x)$.

Figure 17C:
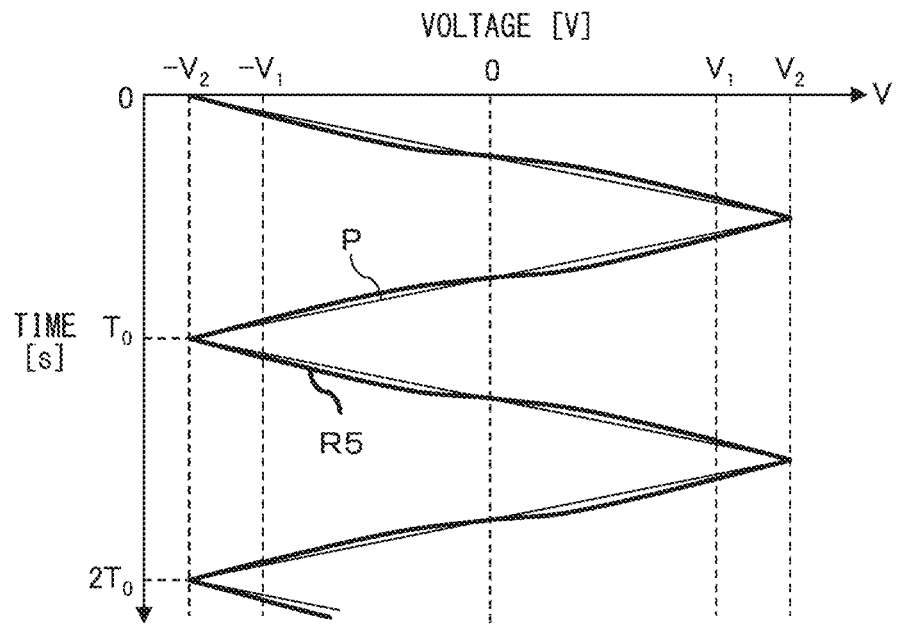
FIG. 17C is a graph illustrating an example of a correction control waveform that realizes the ion irradiation amount distribution having a non-uniform shape.

FIG. 17C is a graph illustrating an example of the correction control waveform R5 for realizing the ion irradiation amount distribution $D_5(x)$ having a non-uniform shape. Similarly to the above-described embodiments, a waveform shape is formed which includes the first zone in which a scanning voltage changes from $-V_1$ to $V_1$ and the third zone in which a scanning voltage changes from $V_1$ to $-V_1$ so that the correction control waveform R5 realizes the scanning speed distribution $S_5(x)$ in the irradiation area. Further, the scanning period $T_0$ is adjusted by setting the staying time for the second zone in which the scanning voltage changes from $V_1$ to $V_2$ and returns to $V_1$ and the fourth zone in which the scanning voltage changes from $-V_1$ to $-V_2$ and returns to $-V_1$ so that the ion irradiation amount per unit time becomes the target value. By generating the correction control waveform R5, the ion irradiation amount distribution having a non-uniform shape is realized, and the ion irradiation amount per unit time may be adjusted to the target value.

Modified Example 9

Figure 18:
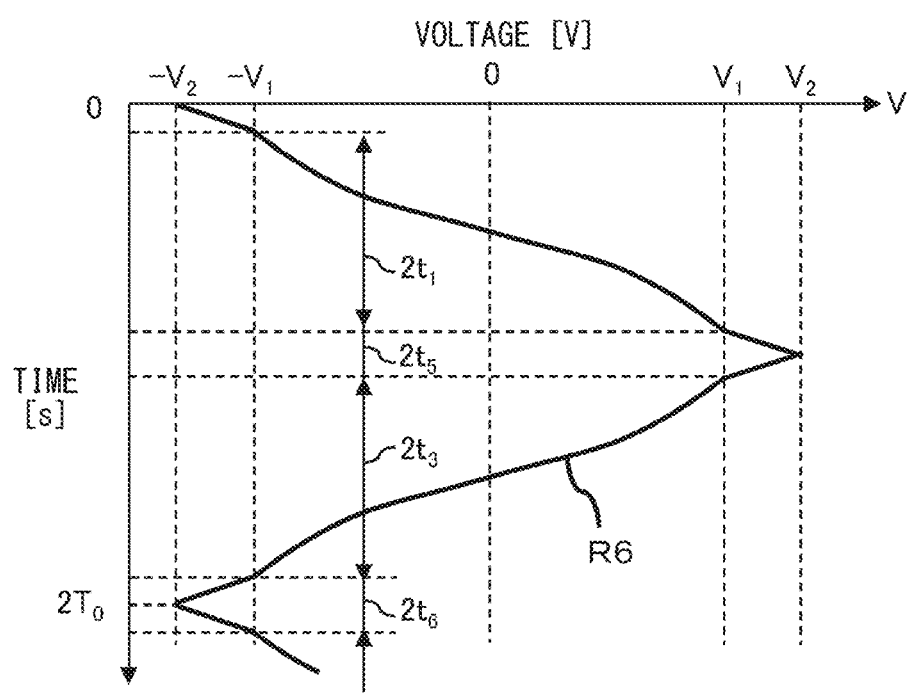
FIG. 18 is a graph illustrating an example of a correction control waveform according to a modified example.

FIG. 18 is a graph illustrating an example of the correction control waveform R6 according to the modified example. The correction control waveform R6 according to the modified example has a shape which is proportional to the correction control waveform R illustrated in FIG. 8B and a shape in which the time taken for the ion beam to pass through the first zone to the fourth zone becomes two times so that the scanning period $T_6$ becomes two times. When the ion beam is scanned based on the correction control waveform R6 according to the modified example, the time taken for one reciprocating scanning operation becomes two times, and hence the ion irradiation amount for one reciprocating operation also becomes two times. Specifically, the ion irradiation amount distribution obtained by the one reciprocating scanning operation becomes $2D_2(x)$ corresponding to two times the ion irradiation amount distribution $D_2(x)$ illustrated in FIG. 9B. Meanwhile, the ion irradiation amount distribution per unit time is balanced out by the ion irradiation amount distribution which becomes two times due to the scanning period which becomes two times, and hence becomes the case where the ion beam is scanned based on the correction control waveform R. In this way, it is possible to adjust the ion irradiation amount distribution per unit time to the target value by generating the correction control waveform R6 according to the modified example based on the correction control waveform R obtained in the above-described embodiments. In addition, the relation between the period $T_0$ of the correction control waveform R and the scanning period $T_6$ of the correction control waveform according to the modified example is not limited to two times, and the scanning period of $T_6=\alpha T_0$ may be set by using an arbitrary constant $\alpha$.

The correction control waveform R6 according to the modified example may be generated as below. First, the third scanning speed distribution $S_6(x)$ of $S_1(x)/\alpha$ is calculated by setting the value of the second scanning speed distribution $S_1(x)$ corresponding to the correction control waveform R to $1/\alpha$. Further, the third scanning period $T_6$ of $\alpha T_0$ is calculated by setting the value of the second scanning period $T_0$ corresponding to the correction control waveform R to be $\alpha$ times. The correction control waveform R6 according to the modified example may be obtained by obtaining the correction control waveform for obtaining both the calculated third scanning speed distribution $S_6(x)$ and the third scanning period $T_6$ in a compatible state by the same method as the above-described embodiments or the above-described modified examples.

It should be understood that the invention is not limited to the above-described embodiment, but may be modified into various forms on the basis of the spirit of the invention. Additionally, the modifications are included in the scope of the invention.

What is claimed is:

1. An ion implantation method for implanting ions into a wafer by scanning an ion beam in a reciprocating manner while reciprocating the wafer in a direction perpendicular to a beam scanning direction, the ion implantation method comprising:
    scanning the ion beam by outputting a reference control waveform to a beam scanner;
    measuring an ion irradiation amount distribution of the ion beam in the beam scanning direction, wherein the ion beam is scanned based on the reference control waveform;
    generating a correction control waveform by using the measured ion irradiation amount distribution; and
    irradiating the ion beam to the wafer by outputting the generated correction control waveform to the beam scanner, wherein the ion beam is scanned based on the correction control waveform,
    wherein the reference control waveform is a control waveform for scanning the ion beam so that a scanning speed distribution indicating a change value of each beam position in time in the beam scanning direction at a wafer position becomes a first scanning speed distribution and a scanning period becomes a first scanning period,
    wherein the ion irradiation amount distribution indicates the distribution of the total ion irradiation amount of each beam position in the beam scanning direction at the wafer position when scanning the ion beam over the wafer a predetermined number of times in a reciprocating manner,
    wherein the correction control waveform is a control waveform for scanning the ion beam so that the scanning speed distribution becomes a second scanning speed distribution and a scanning period becomes a second scanning period,
    wherein the second scanning speed distribution is a scanning speed distribution for scanning the ion beam so that the ion irradiation amount distribution becomes a target distribution,
    wherein the second scanning period is a scanning period that is adjusted so that the ion irradiation amount distribution per unit time of the ion beam scanned by the second scanning speed distribution becomes a target value, and wherein the generating the correction control waveform includes:

calculating the second scanning speed distribution by using the first scanning speed distribution and the measured ion irradiation amount distribution; and calculating the second scanning period by using the calculated second scanning speed distribution.

2. The ion implantation method according to claim 1, wherein the target distribution is an ion irradiation amount distribution that becomes uniform in the beam scanning direction compared to the measured ion irradiation amount distribution.

3. The ion implantation method according to claim 1, wherein the target distribution is an ion irradiation amount distribution having an arbitrary non-uniform shape.

4. The ion implantation method according to claim 1, wherein the generating the correction control waveform further includes:

generating an intermediate control waveform so as to scan the ion beam by the calculated second scanning speed distribution;

scanning the ion beam based on the intermediate control waveform by outputting the generated intermediate control waveform to the beam scanner; and measuring the ion irradiation amount distribution per unit time of the ion beam scanned based on the intermediate control waveform, wherein the second scanning period is calculated by using the ion irradiation amount distribution per unit time measured for the ion beam scanned based on the intermediate control waveform.

5. The ion implantation method according to claim 1, wherein the beam scanner is configured to scan the ion beam in a range including an irradiation area where the reciprocated wafer is located and a non-irradiation area which is located outside the irradiation area, wherein the generating the correction control waveform further includes:

calculating an irradiation time taken for scanning the ion beam over the irradiation area in a reciprocating manner, wherein the ion beam is scanned by the calculated second scanning speed distribution; and calculating a non-irradiation time in which the ion beam is located in the non-irradiation area by subtracting the irradiation time from the second scanning period, and wherein the correction control waveform is generated so that the ion beam is scanned over the irradiation area by the second scanning speed distribution and the ion beam is located at the non-irradiation area for the non-irradiation time.

6. The ion implantation method according to claim 5, wherein the reference control waveform is configured so that the ion beam is scanned over the irradiation area by the first scanning speed distribution and the ion beam is located at the non-irradiation area for a predetermined time, wherein the calculating the second scanning period further includes matching the second scanning period to the first scanning period by setting the non-irradiation time to a time different from the predetermined time when the time taken for scanning the ion beam over the irradiation area in a reciprocating manner by the first scanning speed distribution is different from the irradiation time, and wherein the correction control waveform is generated so as to match the scanning period to the first scanning period.

7. The ion implantation method according to claim 5, wherein the correction control waveform is generated so that the ion beam is scanned in the non-irradiation area at a constant scanning speed.

8. The ion implantation method according to claim 7, wherein the correction control waveform of which the non-irradiation time is adjusted is generated by adjusting a range included in the non-irradiation area over which the ion beam is scanned.

9. The ion implantation method according to claim 5, wherein the correction control waveform is generated so as to temporarily stop the ion beam scanning at any position included in the non-irradiation area.

10. The ion implantation method according to claim 5, wherein the generating the correction control waveform includes:

calculating a third scanning speed distribution and a third scanning period by using the calculated second scanning speed distribution and the calculated second scanning period; and generating the correction control waveform for scanning the ion beam so that the scanning speed distribution becomes the third scanning speed distribution and the scanning period becomes the third scanning period, wherein the third scanning period is a scanning period obtained by multiplying the second scanning period by a predetermined constant, wherein the third scanning speed distribution is a scanning speed distribution that is proportional to the second scanning speed distribution and a scanning speed distribution in which the time taken for scanning over the irradiation area in a reciprocating manner by the third scanning speed distribution is a time obtained by multiplying the irradiation time by the predetermined constant, and wherein the generated correction control waveform is output to the beam scanner, and the ion beam scanned by the third scanning speed distribution for the third scanning period is irradiated to the wafer.

11. The ion implantation method according to claim 1, wherein the second scanning speed distribution is calculated so that a first ion irradiation amount obtained by integrating the ion irradiation amount distribution in the beam scanning direction when the ion beam is scanned by the first scanning speed distribution matches a second ion irradiation amount obtained by integrating the ion irradiation amount distribution in the beam scanning direction when the ion beam is scanned by the second scanning speed distribution.

12. The ion implantation method according to claim 1, further comprising adjusting a beam current amount of the ion beam at the upstream side of the beam scanner in order to set an ion implantation condition, wherein the adjusting the beam current amount includes performing a coarse adjustment so that the ion irradiation amount distribution per unit time becomes close to the target value by adjusting of the beam current amount, and wherein the ion beam is precisely adjusted so that the ion irradiation amount distribution per unit time becomes the target value by calculating the second scanning speed distribution and the second scanning period using the ion irradiation amount distribution measured for the coarsely adjusted ion beam.

13. The ion implantation method according to claim 12,
wherein the coarse adjustment includes changing an aperture ratio of a variable aperture that is provided at the upstream side of the beam scanner and through which the ion beam passes.

14. The ion implantation method according to claim 12,
wherein the coarse adjustment includes adjusting the beam current amount so that the ion irradiation amount distribution per unit time measured when the ion beam is scanned based on the reference control waveform exceeds the target value.

15. The ion implantation method according to claim 12,
wherein the beam scanner is configured to scan the ion beam in a range including an irradiation area where the reciprocated wafer is located and a non-irradiation area which is located outside the irradiation area, and
wherein the reference control waveform is configured so that the ion beam is scanned in the range including both the irradiation area and the non-irradiation area, and
wherein the coarse adjustment includes adjusting the beam current amount so that the ion irradiation amount distribution per unit time becomes a value close to the target value when the ion beam is scanned in the range including both the irradiation area and the non-irradiation area based on the reference control waveform.

16. An ion implantation apparatus comprising:
a beam scanner;
a reciprocation device that is provided at the downstream side of the beam scanner and reciprocates a wafer in a direction perpendicular to a beam scanning direction;
a beam measurement unit that is able to measure an ion irradiation amount distribution in the beam scanning direction at a wafer position; and
a control unit that outputs a control waveform to the beam scanner for scanning the ion beam in a reciprocating manner,
wherein the control unit includes:
an output unit that outputs a reference control waveform to the beam scanner;
an acquisition unit that acquires the ion irradiation amount distribution measured for the ion beam scanned based on the reference control waveform from the beam measurement unit; and
a generation unit that generates a correction control waveform by using the acquired ion irradiation amount distribution,
wherein the reference control waveform is a control waveform for scanning the ion beam so that a scanning speed distribution indicating a change value of each beam position in time in the beam scanning direction at a wafer position becomes a first scanning speed distribution and a scanning period becomes a first scanning period,
wherein the ion irradiation amount distribution indicates the distribution of the total ion irradiation amount of each beam position in the beam scanning direction at the wafer position when scanning the ion beam over the wafer a predetermined number of times in a reciprocating manner,
wherein the correction control waveform is a control waveform for scanning the ion beam so that the scanning speed distribution becomes a second scanning speed distribution and the scanning period becomes a second scanning period,
wherein the second scanning speed distribution is a scanning speed distribution for scanning the ion beam so that the ion irradiation amount distribution becomes a target distribution,
wherein the second scanning period is a scanning period that is adjusted so that the ion irradiation amount distribution per unit time of the ion beam scanned by the second scanning speed distribution becomes a target value,
wherein the generation unit includes a first calculation unit that calculates the second scanning speed distribution by using the first scanning speed distribution and the acquired ion irradiation amount distribution, and a second calculation unit that calculates the second scanning period by using the calculated second scanning speed distribution, and
wherein the generated correction control waveform is output to the beam scanner, and the ion beam scanned based on the correction control waveform is irradiated to the wafer.

17. The ion implantation apparatus according to claim 16, further comprising a beam current adjustment unit that is provided at the upstream side of the beam scanner and adjusts a beam current amount of the ion beam,
wherein the control unit further includes an adjustment unit that controls the beam current adjustment unit in order to set an ion implantation condition,
wherein the adjustment unit performs a coarse adjustment so that the ion irradiation amount distribution per unit time becomes close to the target value by controlling the beam current adjustment unit to adjust the beam current amount, and
wherein the generation unit performs a precise adjustment so that the ion irradiation amount distribution per unit time becomes the target value by calculating the second scanning speed distribution and the second scanning period using the ion irradiation amount distribution acquired for the coarsely adjusted ion beam.

18. The ion implantation apparatus according to claim 16, further comprising:
a protective plate that is provided at the downstream side of the beam scanner and interrupts a part of the scanned ion beam,
wherein the beam scanner is configured to scan the ion beam in a range including an irradiation area where the reciprocated wafer is located and a non-irradiation area which is located outside the irradiation area, and
wherein the protective plate is disposed so as to interrupt at least a part of the ion beam directed to the non-irradiation area.

19. The ion implantation apparatus according to claim 18,
wherein the beam measurement unit includes a center cup that is able to measure the ion irradiation amount distribution of the irradiation area at the wafer position and side cups that are able to measure the ion irradiation amount of the ion beam directed to the non-irradiation area during the ion implantation processing on the wafer, and
wherein the protective plate is disposed at a position where the ion beam directed to the side cups is not interrupted.

* * * * *